United States Patent [19]

Shalkauser et al.

[11] Patent Number: 5,057,917
[45] Date of Patent: Oct. 15, 1991

[54] REAL-TIME DATA COMPRESSION OF BROADCAST VIDEO SIGNALS

[75] Inventors: Mary Jo W. Shalkauser, North Olmstead; Wayne A. Whyte, Jr., Olmstead Township, both of Ohio; Scott P. Barnes, Santa Monica, Calif.

[73] Assignee: The United States of America as represented by the administrator of the National Aeronautics and Space Administration, Washington, D.C.

[21] Appl. No.: 611,214

[22] Filed: Nov. 9, 1990

Related U.S. Application Data

[63] Continuation-in-part of Ser. No. 540,976, Jun. 20, 1990.

[51] Int. Cl.$^5$ .............................................. H04N 7/13
[52] U.S. Cl. ....................................... 358/135; 358/133
[58] Field of Search ................... 358/135, 13, 133, 12, 358/138, 427

[56] References Cited

U.S. PATENT DOCUMENTS

| | | | |
|---|---|---|---|
| 4,125,861 | 11/1978 | Mounts et al. | 358/133 |
| 4,363,036 | 12/1982 | Subramaniam | 358/261 |
| 4,396,906 | 8/1983 | Weaver | 340/347 |
| 4,494,108 | 1/1985 | Langdon, Jr. et al. | 340/347 |
| 4,531,151 | 7/1985 | Hentschke | 358/135 |
| 4,667,251 | 5/1987 | Hasegawa | 358/283 |
| 4,782,387 | 11/1988 | Sabri et al. | 358/138 X |
| 4,843,467 | 6/1989 | Reimann et al. | 358/135 |
| 4,901,139 | 2/1990 | Wilkinson et al. | 358/135 X |
| 4,924,298 | 5/1990 | Kitamura | 358/138 X |

OTHER PUBLICATIONS

Khalid Sayood et al, "Data Compression for the Microgravity Experiments" 6/21/89; Sec. 3.2.

*Primary Examiner*—Victor R. Kostak
*Attorney, Agent, or Firm*—James A. Mackin; Gene E. Shook; Harold W. Adams

[57] ABSTRACT

A non-adaptive predictor, a nonuniform quantizer and a multi-level Huffman coder are incorporated into a differential pulse code modulation system for coding and decoding broadcast video signals in real time.

19 Claims, 14 Drawing Sheets

| DIFFERENCE VALUE | QUANTIZATION LEVEL | QUANTIZATION VALUE | NON-ADAPTIVE PREDICTION |
|---|---|---|---|
| -255 TO -86 | 1 | -100 | -85 |
| -85 TO -60 | 2 | -66 | -61 |
| -59 TO -34 | 3 | -42 | -38 |
| -33 TO -19 | 4 | -25 | -22 |
| -18 TO -9 | 5 | -14 | -11 |
| -8 TO -4 | 6 | -6 | -4 |
| -3 TO 3 | 7 | 0 | 0 |
| 4 TO 8 | 8 | 6 | 4 |
| 9 TO 18 | 9 | 14 | 11 |
| 19 TO 33 | 10 | 25 | 21 |
| 34 TO 59 | 11 | 42 | 38 |
| 60 TO 85 | 12 | 66 | 61 |
| 86 TO 255 | 13 | 100 | 84 |

HUFFMAN CODE MATRIX $QL_N$ (rows, 1 to 13) vs $QL_{N-1}$ (columns, 1 to 14)

| $QL_N$ \ $QL_{N-1}$ | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 13 | 4 | 8 | 8 | 10 | 10 | 11 | 11 | 11 | 10 | 10 | 8 | 6 | 4 | 6 |
| 12 | 4 | 8 | 8 | 10 | 10 | 11 | 9 | 10 | 8 | 8 | 6 | 4 | 4 | 6 |
| 11 | 4 | 8 | 8 | 10 | 10 | 9 | 8 | 7 | 6 | 3 | 4 | 3 | 4 | 6 |
| 10 | 4 | 8 | 8 | 7 | 7 | 7 | 6 | 6 | 3 | 1 | 2 | 3 | 4 | 4 |
| 9 | 4 | 8 | 5 | 6 | 5 | 6 | 4 | 4 | 2 | 3 | 2 | 4 | 4 | 6 |
| 8 | 4 | 4 | 5 | 5 | 4 | 3 | 2 | 2 | 2 | 3 | 2 | 4 | 4 | 6 |
| 7 | 4 | 4 | 4 | 4 | 2 | 1 | 1 | 1 | 2 | 4 | 4 | 4 | 4 | 1 |
| 6 | 4 | 8 | 4 | 3 | 2 | 2 | 3 | 3 | 4 | 5 | 5 | 4 | 4 | 6 |
| 5 | 4 | 3 | 2 | 3 | 2 | 4 | 5 | 5 | 5 | 6 | 6 | 4 | 4 | 6 |
| 4 | 4 | 1 | 2 | 1 | 3 | 5 | 7 | 8 | 7 | 7 | 7 | 7 | 4 | 6 |
| 3 | 4 | 4 | 2 | 3 | 6 | 8 | 11 | 10 | 10 | 10 | 8 | 8 | 4 | 6 |
| 2 | 4 | 8 | 5 | 8 | 8 | 11 | 11 | 10 | 10 | 10 | 8 | 8 | 4 | 6 |
| 1 | 4 | 8 | 8 | 10 | 10 | 11 | 11 | 11 | 10 | 10 | 8 | 8 | 4 | 6 |

REAL-TIME DATA COMPRESSION OF BROADCAST VIDEO SIGNALS

ORIGIN OF THE INVENTION

This invention was made by employees of the United States Government and may be manufactured or used by or for the Government without the payment of any royalties thereon or therefor.

REFERENCE TO CO-PENDING APPLICATION

This is a continuation-in-part of co-pending application Ser. No. 540,976 filed June 20, 1990.

TECHNICAL FIELD

This invention relates to the transmission and reception of video signals and is directed more particularly to a method and apparatus for digitally coding and decoding video signals utilizing differential pulse code modulation.

BACKGROUND OF THE INVENTION

Transmission of television signals in a digital format has been viewed as promising for a number of years. Digital systems providing teleconference quality video have become commonplace in both government and industry. However, digital transmission of toll-grade or broadcast quality television signals has not yet achieved such acceptance.

This results, in part, from the broadcasters, reluctance to allow any kind of processing on the transmitted signals. To a greater extent, digital transmission of broadcast quality video has failed to gain acceptance because it has not been cost-effective. The lack of available wideband digital links, as well as the complexity of implementation of bandwidth efficient digital video CODEC (coder/decoder) has kept the cost of digital television transmission too high to compete with analog methods.

Advances in very large-scale integration, as well as recent work in the field of advanced digital modulation techniques, have combined to make digital video processing technically feasible and potentially cost competitive for broadcast quality television transmission. The coupling of a transparent, bandwidth efficient, data compression technique with a bandwidth efficient modulation technique offer the potential for a transmission of two or more high-quality television signals in the same bandwidth occupied by a signal frequency-modulated television signal.

In the past, differential pulse code modulation (DPCM) has been one of the most popular predictive image coding methods of video signals due to its simplicity of implementation and overall subjective performance characteristics. One of the most serious problems with DPCM schemes has been that three to four bits/pixel were required to achieve acceptable image quality, with four bits/pixel generally preferred to maintain a broadcast quality picture representation.

Patents which appear to be relevant to the invention described herein are as follows:

U.S. Pat. No. 4,125,861 to Mounts et al describes a method and apparatus for decreasing the entropy of an encoded signal by 25% over conventional techniques which employ DPCM. Mounts et al utilize a DPCM predictor, a non-uniform adaptive quantizer, and a variable length encoder for data compression of video images. The adaptive quantizer, depending on picture content, adaptively forces the quantizer output to a particular value different from the normal output. This forced change places more quantized picture elements into particular quantization levels, thus taking greater advantage of the compression gained by the variable length encoder. The forced change of quantizer output level is acceptable only when it is not harmful to the picture fidelity.

U.S. Pat. No. 4,396,906 to Weaver describes a method and apparatus for implementation of a Huffman encoder/decoder which utilizes a particular code word structure to simplify the encode/decode process. The code word structure is a "truncated Huffman code set" which allows the encoding and decoding circuitry to be greatly simplified over the circuitry required for conventional Huffman code sets. One drawback of using the "truncated Huffman code set" is that the set is not optimal and will not provide as much compression as an optimal Huffman code set.

U.S. Pat. No. 4,363,036 to Subramaniam describes a method for compressing digital data, which method is useful in facsimile transmission. The technique is not applicable to encoding of NTSC television images due to the specific nature of the scanned facsimile data. A document for facsimile transmission is scanned to generate a digital image for encoding and subsequent transmission. Each pixel is either white or black and is represented by a "one" or a "zero", respectively. A non-adaptive predictive technique is used to predict the pixel values and source states for each pixel. The prediction Table and Source State Tables are pregenerated based upon the Markov model of several source images.

U.S. Pat. No. 4,667,251 to Hasegawa describes a method and apparatus useful for the encoding and transmission of half-tone images. A dithering process is used to convert an analog half-tone image into a binary code. Typically, the binarized picture signal contains a large number of white-to-black transitions which, therefore, does lend itself to efficient encoding for transmission. According to this invention, the analog halftone signal is binarized by a dithering process and then is passed through a correlation processing stage prior to encoding for transmission.

U.S. Pat. No. 4,494,108 to Langdon et al discloses a method for adaptively modeled symbol source statistics to achieve efficient compression coding. An encoder adaptively computes and maintains statistics on the input data and uses the statistics to encode the data into a variable length string via a linearized tree structure. The decompression circuitry detects the ends of the variable length codes and decodes them. The data is then reconstructed using an adaptive statistics unit and a model structure unit.

DISCLOSURE OF THE INVENTION

In accordance with the invention, there is provided a method and apparatus based on DPCM coding and decoding broadcast quality video signals in real time. The invention provides for nonuniform quantization and multilevel Huffman coding to reduce the data rate substantially below that achievable with normal DPCM.

It is an object of the invention to provide for real-time coding/decoding of broadcast quality video signals at a low bits/pixel ratio.

It is another object of the invention to utilize in the DPCM an intrafield approach with a two-dimensional prediction based on averaging neighboring pixel values having the same color subcarrier phase relationship as the current pixel.

A further object of the invention is to utilize the fact that neighboring pixels fall into the same or close to the same quantization level by utilizing a non-adaptive predictor (NAP) to improve edge encoding performance and also by utilizing multilevel Huffman code sets to provide significant reductions in bits per pixel.

Still another object of the invention is to provide a coding/decoding video transmitting/receiving system wherein DPCM prediction is subtracted from current pixel value, which value less the NAP value causes the resulting difference value (DIF) to be close to zero.

It is another object of the invention to utilize a non-uniform quantizer the difference value (DIF) so that more levels are provided for small magnitude differences which would result from subtle changes in picture content.

Still another object of the invention is to utilize line and field unique words inserted at the beginning of each line and field, respectively, for maintaining system synchronization in the event that channel errors occur to minimize the impact on the quality of the reconstructed image.

Yet another object of the invention is to provide a method and apparatus wherein the first four pixels of every line are transmitted uncompressed as a means of providing a reference to the coding/decoding video transmitting/receiving system on a periodic basis.

DESCRIPTION OF THE DRAWINGS

FIG. 8 is a chart showing the quantization and nonadaptive prediction values utilized in the system embodying the invention.

FIG. 14 is a chart displaying a multilevel Huffman code set matrix.

Tables I, II, and III show the Huffman encoder/decoder PROM contents.

DEFINITIONS

| | | | |
|---|---|---|---|
| CODEC | encoder/decoder | PIX | pixel |
| A/D | analog to digital converter | PROM | programmable read only memory |
| CS | chip select | | |
| D/A | digital to analog converter | PV | predicted value |
| DIF | difference value | RAM | random access memory |
| DIP | dual in line package | ROM | read only memory |
| DPCM | differential pulse code modulation | RP | reconstructed pixel |
| FIFO | first in, first out | $QL_N$ | quantization level |
| MUX | multiplexer | $QL_{N-1}$ | quantization level delayed by one pixel time |
| NAP | non-adaptive predictor value | | |
| NTSC | National Television Systems Committee | QV | quantization value |

DESCRIPTION OF A PREFERRED EMBODIMENT

Figure 1:
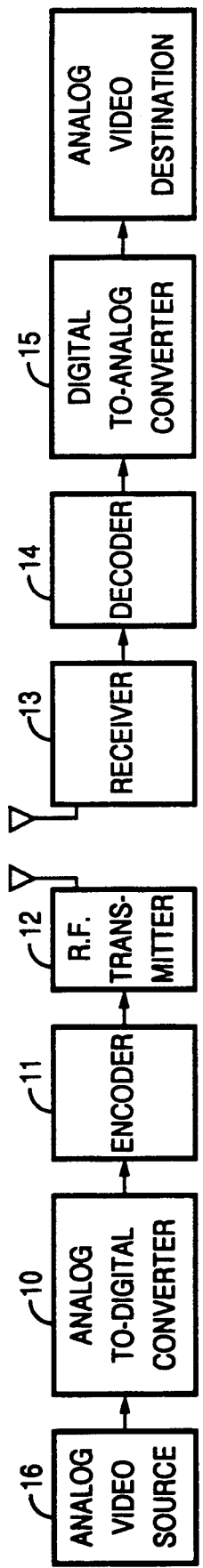
FIG. 1 is a block diagram showing an overall system for realtime data compression of broadcast video signals.

Referring now to FIG. 1, there is shown a real-time data compression system for broadcast video signals and comprising an analog to digital converter 10, an encoder 11, and RF transmitter 12, a receiver 13, a decoder 14, and a digital to analog converter 15. An analog video signal source 16 supplies an analog video signal to A/D 10 which provides a digital output to encoder 11. The encoded video signal is, in turn, supplied to RF transmitter 12 for transmission in the form of radio frequency electromagnetic waves.

The transmitted signal is detected by receiver 13 and fed to decoder 14. Decoder 14 supplies the decoded signal to D/A 15 for conversion to an analog video signal. The analog video signal is then utilized in a standard manner as, for example, as a video signal or as a stored video image. The origin of the signal utilized in the DPCM system embodying the invention is obtained from a common, well-known analog video source or generator such as 16.

Figure 2:
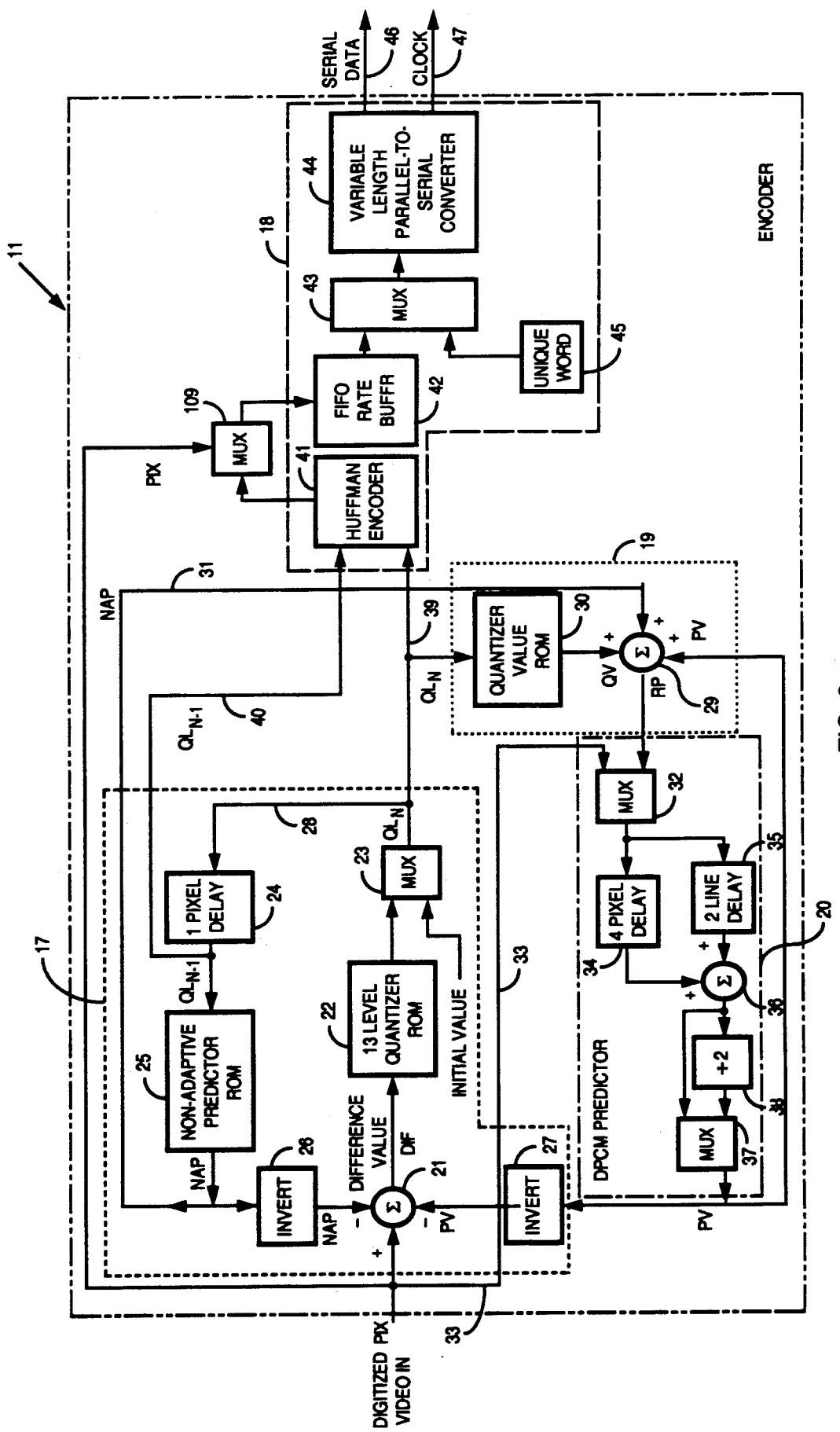
FIG. 2 is a block diagram of the encoder portion of the system of FIG. 1.

Referring now to FIG. 2, there is shown in block diagram form the encoder 11 comprising a NAP/adder/quantization circuit 17, a Huffman encoder/shift register 18, a quantization value ROM/adder 19, and a DPCM predictor circuit 20. The NAP/adder/quantization circuit 17 is made up of an adder 21, a 13 level quantizer ROM 22, a multiplexer 23, a 1 pixel delay 24, a non-adaptive predictor ROM 25, and invert circuit 26, and an invert circuit 27. An 8-bit digitized video signal, PIX, from the A/D 10 of FIG. 1 is directed to adder 21 where it is algebraically combined using two's complement addition with an 8-bit NAP value from invert circuit 26 and an 8-bit predicted value (PV) from invert circuit 27.

The output of adder 21 is an 8-bit difference value (DIF) which is fed to quantizer ROM lookup table 22. The output of quantizer ROM 22 and an initial value are both provided to multiplexer 23. The initial value of 14 (E in hexadecimal) is selected to be the multiplexer 23 output $QL_N$ during the first 4 pixels of each video line. For the remainder of the line, the quantizer ROM 22 output is selected to be the multiplexer 23 output $QL_N$. The 4-bit $QL_{N-1}$ value is supplied via a lead 28 to the one pixel delay 24 as well as to circuits 18 and 19, as will be explained presently. The output of the one pixel delay 24 is $QL_{N-1}$ which is operated on by the NAP PROM lookup table 25 which produces an 8-bit NAP value for the invert circuit 26 and also for the quantization value ROM/adder 19.

The QV ROM/adder circuit 19 of encoder 11 comprises an adder 29 and a QV ROM lookup table 30. The adder 29 algebraically adds an NAP value received from NAP ROM 25 via a lead 31, a QV value received from ROM 30, and a PV signal received from DPCM predictor 20 to yield an RP value. The input to H the ROM 30, $QL_N$ received from multiplexer 23 is used to address the lookup table.

The output of the adder 29 is an 8-bit RP reconstructed pixel value which is directed to a multiplexer 32 in the DPCM predictor 20. Multiplexer 32 also receives the digitized video input signal, PIX, of encoder 11 via a lead 33. During the first four pixels of each video line, the digitized video input PIX is selected to be the multiplexer 32 output. During the remainder of the video line, the RP value from adder 29 output is selected to be the multiplexer 32 output. The output value of multiplexer 32 is directed through both a 4-pixel delay 34 and a 2-line delay 35 to an adder 36 where they are added algebraically. The output of adder 36 is connected directly to one input of a multiplexer 37 and also through a divide-by-2 circuit 38 to a second input of multiplexer 37. The multiplexer 37 output is selected to be the output of adder 36 for the first two lines of each video field when the two line delay 35 output is zero. The multiplexer 37 output is selected to be the output of the divide-by-two circuit 38 for the remainder of the lines of the video field. The circuits described thus far, that is 17, 19 and 20, produce a $QL_N$ signal which is delivered to the Huffman encoder/shift register 18 via a lead 39 and a $QL_{N-1}$ value directed to circuit 18 by a lead 40.

Included in circuit 18 are a Huffman encoder 41, a FIFO rate buffer 42, a multiplexer 43, a variable length parallel-to-serial converter 44 and a unique word circuit insertion 45. Huffman encoder 41 is provided with input values $QL_N$ and $QL_{N-1}$ by a leads 39 and 40, respectively. Huffman encoder 41 is a PROM lookup table addressed by inputs $QL_N$ and $QL_{N-1}$. The data outputs of the Huffman encoder consist of 12-bits for the Huffman code and 4-bits for the length of the Huffman code. The output of the Huffman encoder is fed to a multiplexer 109. A second input to multiplexer 109 is the digitized video input PIX. The multiplexer 109 output is selected to be PIX during the first 4 pixels of every line and the Huffman encoder 41 output for the remainder of the line. The multiplexer 109 output is directed through a FIFO rate buffer 42 to a multiplexer 43 which also receives input from a unique word circuit 45. The output of multiplexer 43 is fed to the converter 44. Converter 44 provides serial data output as at 46 and clock output as at 47. These signals are used to modulate a radio frequency signal which is then transmitted through the air.

Figure 3:
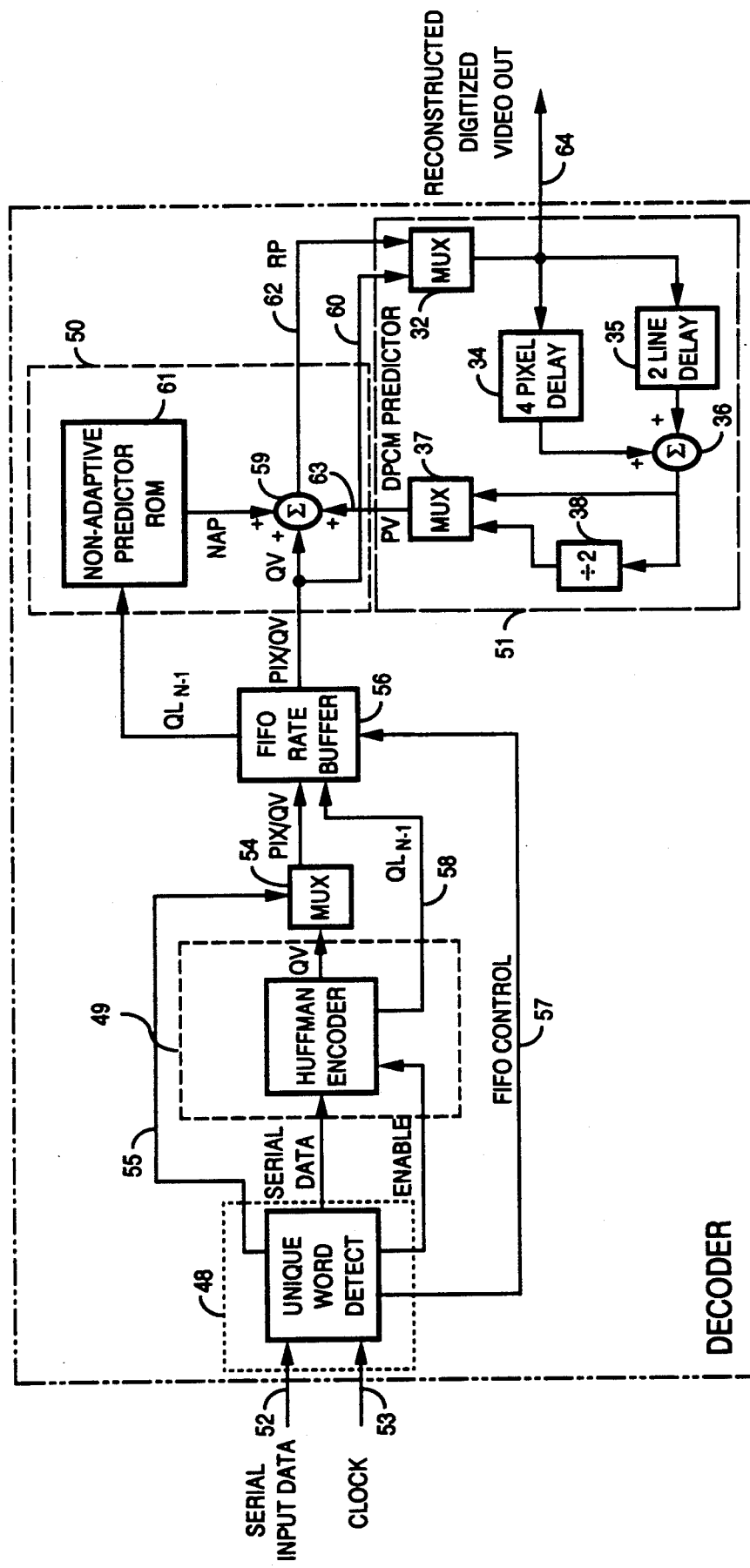
FIG. 3 is a block diagram of the decoder section of the system shown in FIG. 1.

The decoder part of the data compression system embodying the invention as shown in FIG. 3 includes a unique word detect circuit 48, a Huffman decoder 49, a NAP/adder 50 and a DPCM predictor 51. The serial data and clock signal outputted from the encoder 11 of FIG. 2, as at 46 and 47, after RF transmission and reception, are provided as input signals to the unique word detect circuit 48, as at 52 and 53. The serial data is directed to the Huffman decoder 49 from the unique word detect circuit 48 along with an enable signal. The unique word detect circuit 48 also provides a PIX signal during the first four pixels following each unique word in a video line to a multiplexer 54 by means of a lead 55 and supplies a FIFO control signal to a FIFO rate buffer 56 via a lead 57. The FIFO control signal is used to disable writes to the FIFO to regain line and field synchronization when channel errors result in improper decoding of Huffman codes. The Huffman decoder 49 provides a QV (quantization value) signal to a second input of the multiplexer 54 and a $QL_{N-1}$ signal to the FIFO rate buffer 56 by means of a lead 58. A third input to the FIFO rate buffer 56 is a PIX/QV signal which is the output of multiplexer 54. PIX is selected as the multiplexer 54 output during the first four pixels of every line and QV is selected as the multiplexer 54 output during the remainder of the line.

The FIFO rate buffer 56 has two outputs, an 8-bit PIX/QV signal which is directed to an adder 59 of the non-adaptive predictor/adder 50 and also to the DPCM predictor 51 via a lead 60 and a 4-bit $QL_{N-1}$ signal which is directed to a non-adaptive predictor ROM 61 in circuit 50. The output of the non-adaptive predictor ROM lookup table is an NAP value which is supplied to the adder 59 where it is algebraically combined with the QV signal from the FIFO rate buffer and a PV signal from the DPCM predictor 51 to yield an 8-bit reconstructed pixel (RP) value to an input of the DPCM predictor 51 by a lead 62.

The DPCM predictor 51 utilized in the decoder 14 is identical to the DPCM predictor 20 which is part of the encoder 11 and numerals from the predictor 20 will be utilized to identify identical components in the predictor 51. As in the case of the predictor 20, the multiplexer 32 has an RP input and a PIX input. The output of predictor 51 is a PV signal directed to the adder 59 through lead 63. The output of the multiplexer 32 constitutes the reconstructed digitized video output signal which is provided as at 64 to be utilized in video storage or display systems or the like.

Figure 4:
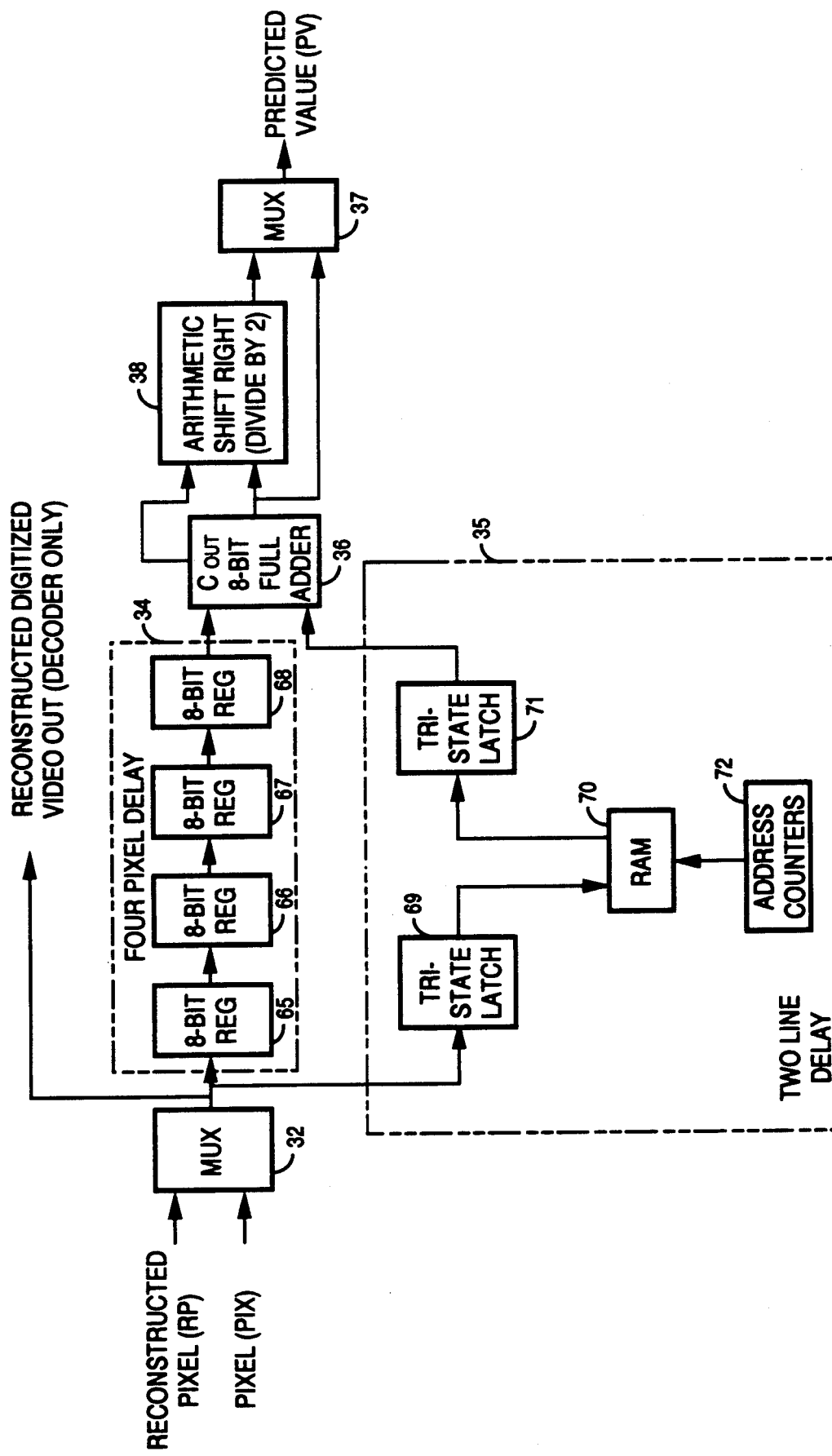
FIG. 4 is a block diagram of a differential pulse code modulation circuit utilized in both the decoder and encoder sections of the system.

FIG. 4 is a more detailed block diagram of the DPCM predictor 20 shown in FIG. 2 and like parts are identified by like numerals. As shown in FIG. 4, the four pixel delay circuit 34 comprises sequential 8-bit registers 65, 66, 67 and 68. In the two-line delay 35 the output signal of multiplexer 32 is directed through a tri-state latch 69 to a RAM 70, the output of which is fed to a latch 71. Address counters 72 addresses the RAM 70. The output of latch 71 is provided as an input to adder 36 along with the output of the 4-pixel delay.

Figure 5:
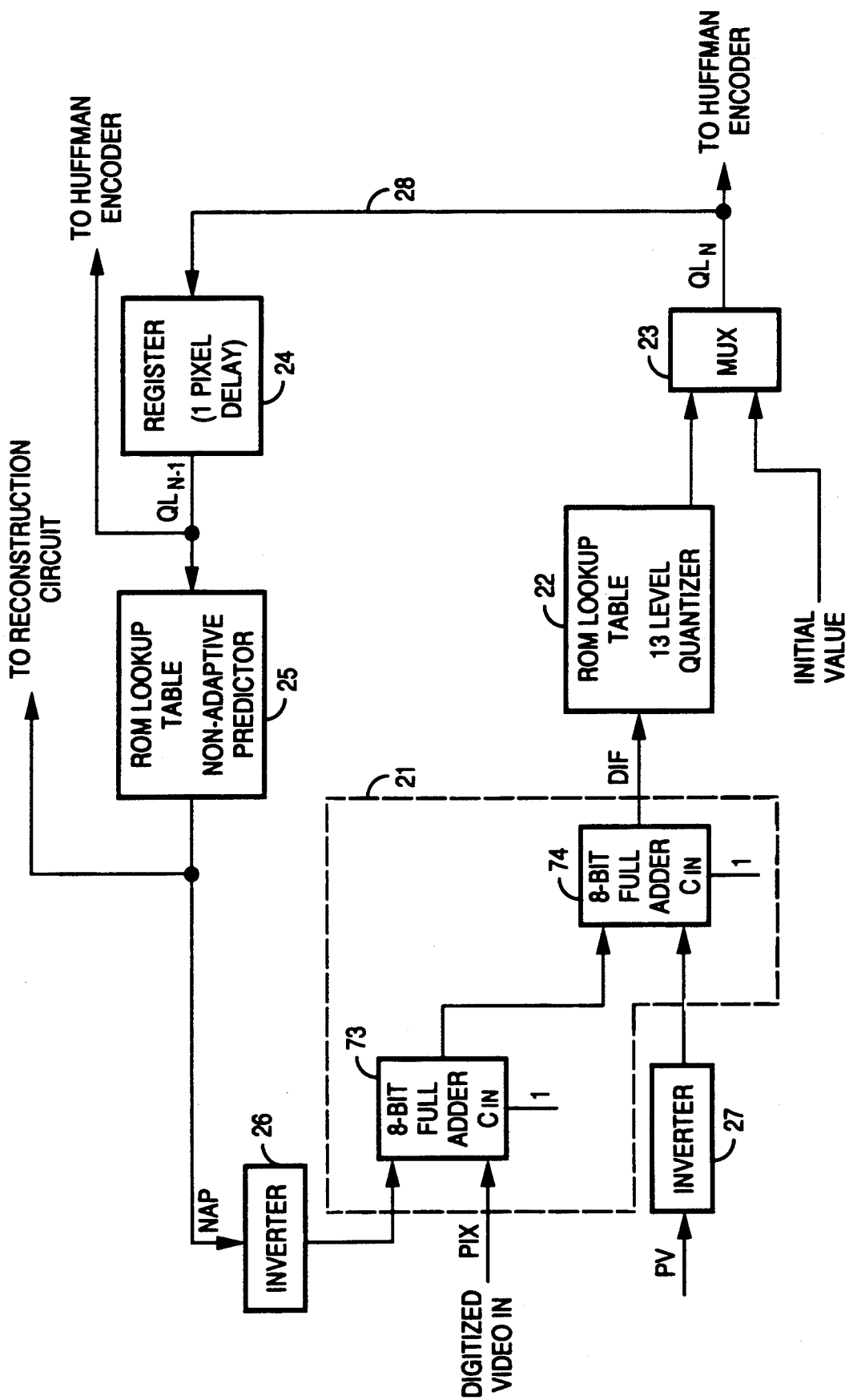
FIG. 5 is a block diagram of a non-adaptive predictor/adder/quantization circuit utilized in the encoder.

FIG. 5 is a somewhat more detailed block diagram of the NAP/adder/ quantization circuit 17 shown in FIG. 2 and like parts are identified by like numerals. FIG. 5 shows that the adder 21 of circuit 17 in FIG. 2 is comprised of 8-bit full adders 73 and 74.

Figure 6:
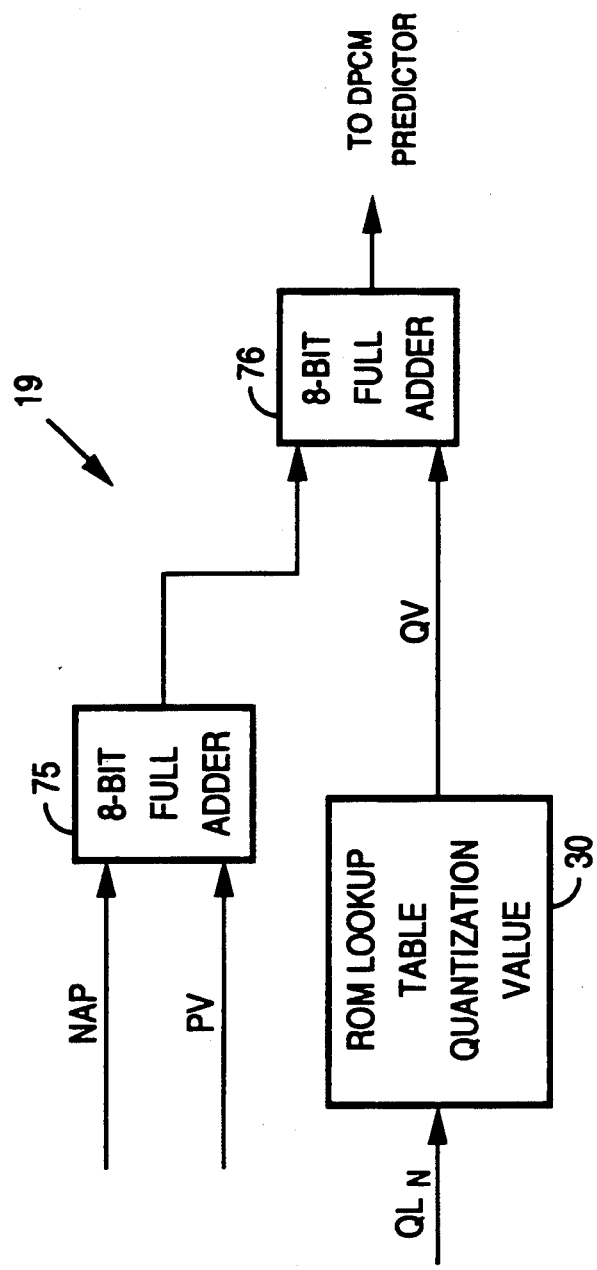
FIG. 6 is a block diagram of the quantization value ROM/adder circuit of the encoder.

FIG. 6 shows the quantization value ROM/adder 19 of FIG. 2 when the adder 29 includes 8-bit full adders 75 and 76.

Figure 7:
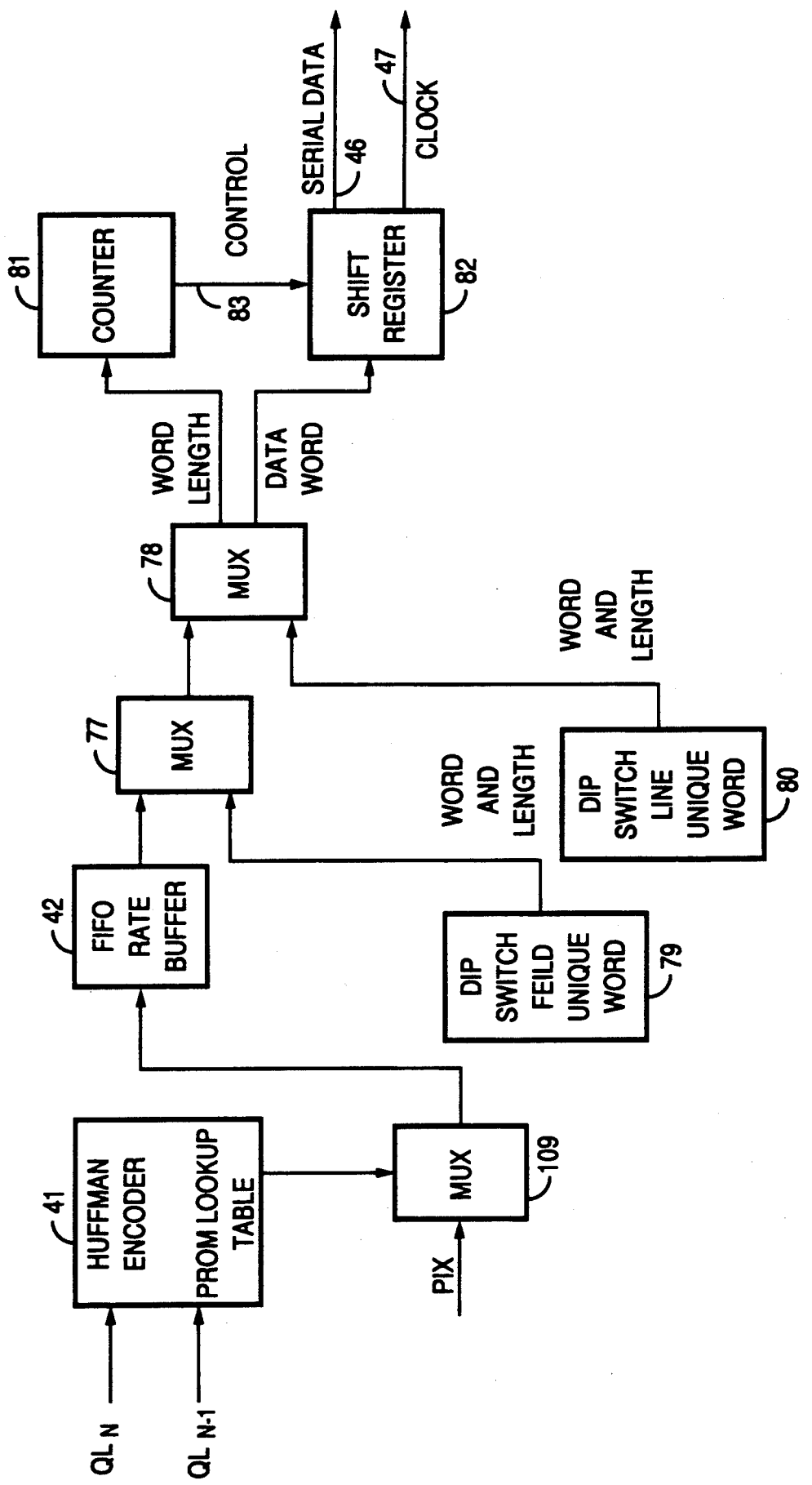
FIG. 7 is a block diagram of a Huffman encoder/shift register incorporated into the encoder.

FIG. 7 is a more detailed block diagram of the Huffman encoder/shift register 18 of FIG. 2 and like parts are identified by like numerals. As will be seen from FIG. 7, multiplexer 43 of circuit 18 includes multiplexers 77 and 78 while the unique word circuit 45 includes DIP switches 79 and 80 which provide inputs to the multiplexers 77 and 78, respectively. Multiplexer 78 provides a word length signal to a counter 81 and a data word signal to a shift register 82, the latter being controlled by counter 81 via a lead 83.

Referring now to FIG. 8, there is shown a chart specifying the quantization levels, quantization values, and non-adaptive prediction values for corresponding difference value ranges. The NAP values were generated from statistics of numerous television images covering a wide range of picture content. These NAP values represent the average difference values calculated within the boundaries of the difference values for each quantization level over the range of example images used. As an example, using the values in FIG. 8, if the DIF for the previous pixel was 40, corresponding to quantization level 11, the value of NAP to be subtracted from the current pixel difference would be 38. To reconstruct the pixel, the decoder uses a look-up table to add back the appropriate NAP value based upon knowledge of the quantization level from the previously decoded pixel. The use of the NAP results in faster convergence at transition points in the image, thereby improving edge detection performance. An additional NAP value, not contained in FIG. 8, is used to initialize each line. The first four pixels of every line are transmitted uncompressed and, therefore, do not result in a quantization level for pixel number four upon which to base the NAP value for pixel number five. A default NAP, having the value 21, is used in determining the value of DIF for the fifth pixel of every line.

Figure 9:
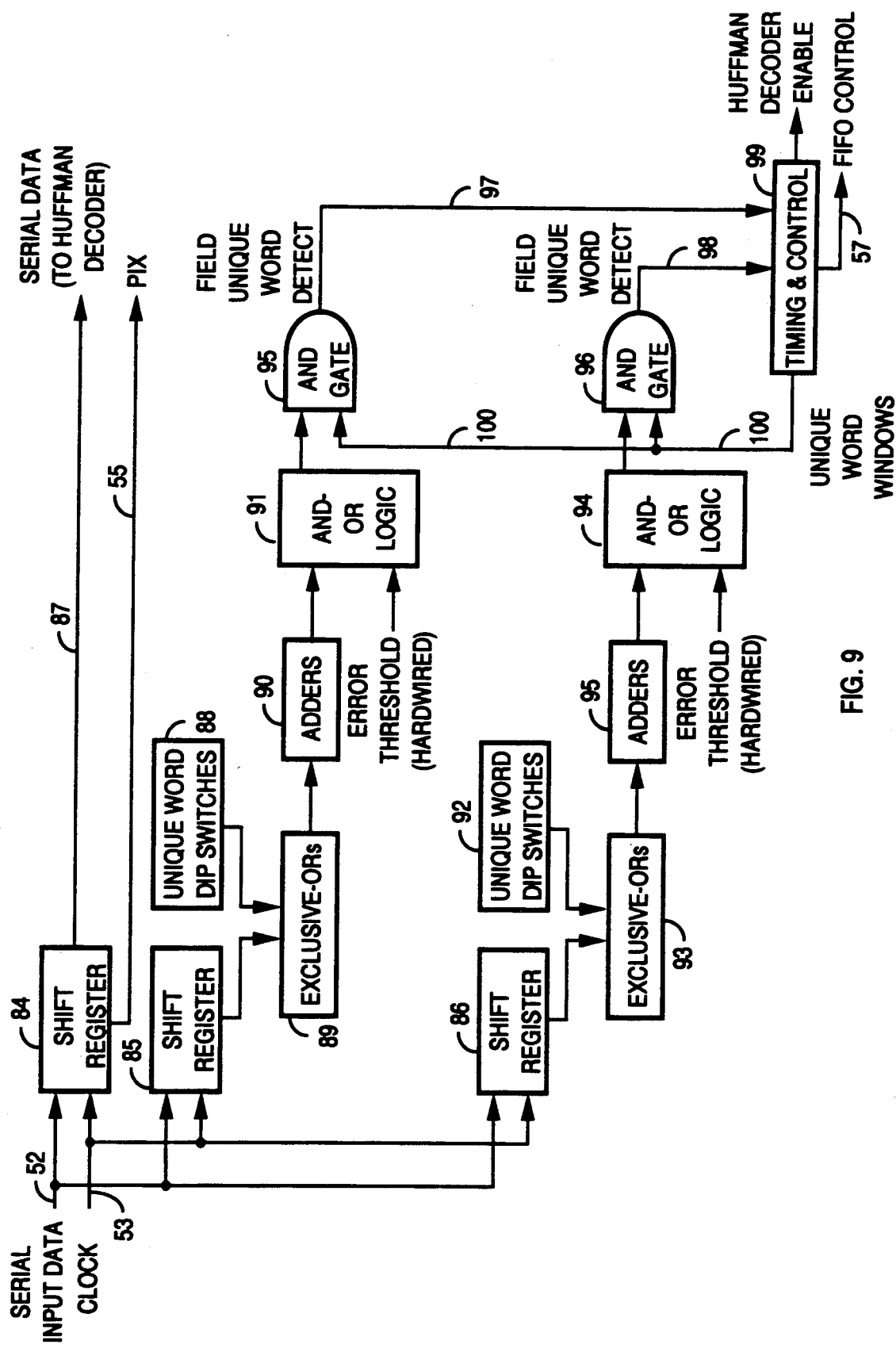
FIG. 9 is a block diagram of a unique word detect circuit employed in the decoder.

FIG. 9 is a detailed block diagram showing the circuits of the unique word detect circuit 48 of FIG. 3 and numerals 52 and 53 from that circuit are used to identify the serial input data and clock signal, respectively. Also, numerals 55 and 57 from FIG. 3 identify the PIX and FIFO control lines, respectively. The serial input data at 52 and the clock signal at 53 are provided to shift registers 84, 85 and 86. Shift register 84 has two outputs, one being the PIX signal as on line 55, the other being the serial data signal, as on line 87.

Shift register 85 and unique word DIP switches 88 containing the correct unique word values provide input to exclusive-OR circuits 89, the output of which is directed to adders 90 where the number of incorrect bits between the input data and the unique word is summed. The adder 90 output is directed to AND-OR logic circuit 91 where the adder 90 output is compared to the error threshold. If the adder 90 output is less than the error threshold then a high true pulse appears at the output of 91.

Similarly, shift register 86 and unique word DIP switches 92 provide input to exclusive-OR circuits 93. The output of 93 is directed to an OR logic circuit 94 through adders 95. The outputs of logic circuits 91 and 94 are directed to AND gates 95 and 96, respectively. The outputs of AND gates 95 and 96 are directed through leads 97 and 98, respectively, to a timing and control circuit 99. The timing and control circuit 99 has three outputs, one of which (unique word windows) is supplied to second inputs of gates 95 and 96 through a lead 100. The field and line unique word window signals are fed back to AND gates 95 and 96, respectively. The unique word window signals are set high by the timing and control circuit 99 before the end of the line or field and are set low after the unique words are detected. The other two outputs are the FIFO control and the Huffman decoder enable.

Figure 10:
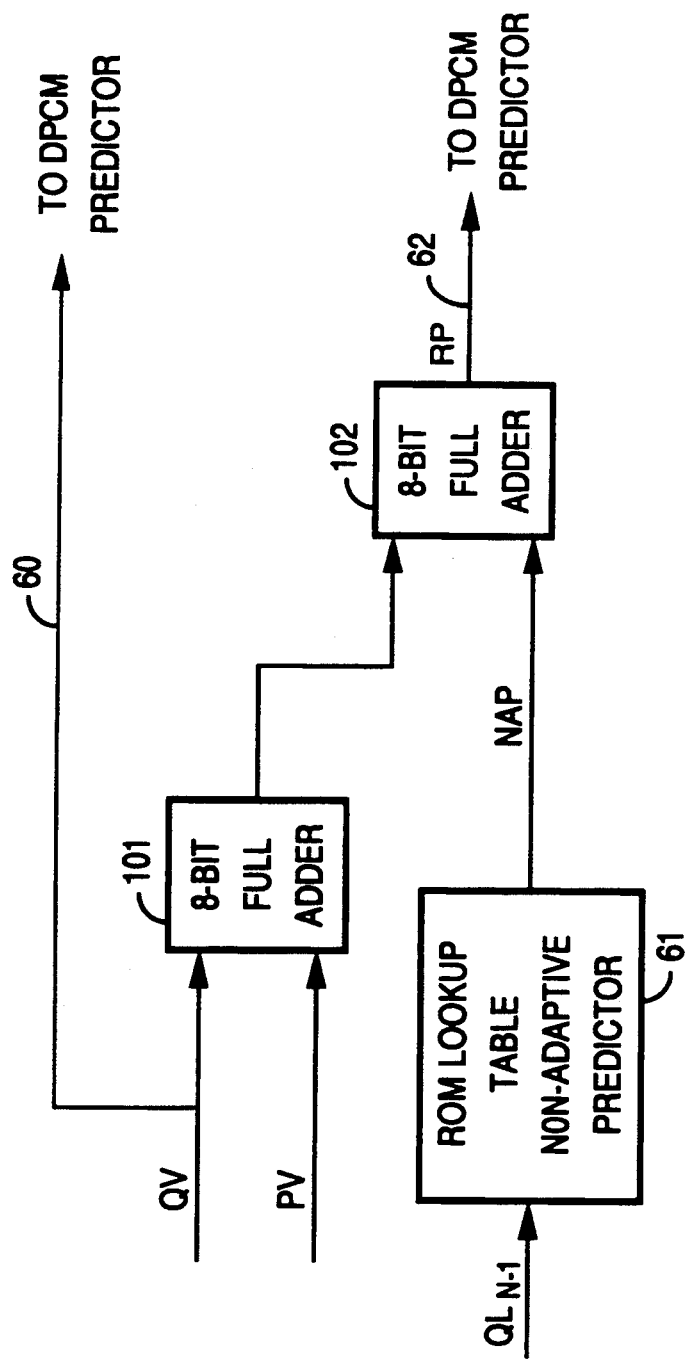
FIG. 10 is a nonadaptive predictor/adder which is part of the decoder section of the system embodying the invention.

FIG. 10 is a slightly more detailed block diagram of the non-adaptive predictor/adder 50 of FIG. 3, and components corresponding to those in FIG. 3 are identified by like numerals. FIG. 10 shows 8-bit adders 101 and 102 which comprise the adder 59 in the non-adaptive predictor/adder circuit 50 of FIG. 3.

Figure 11:
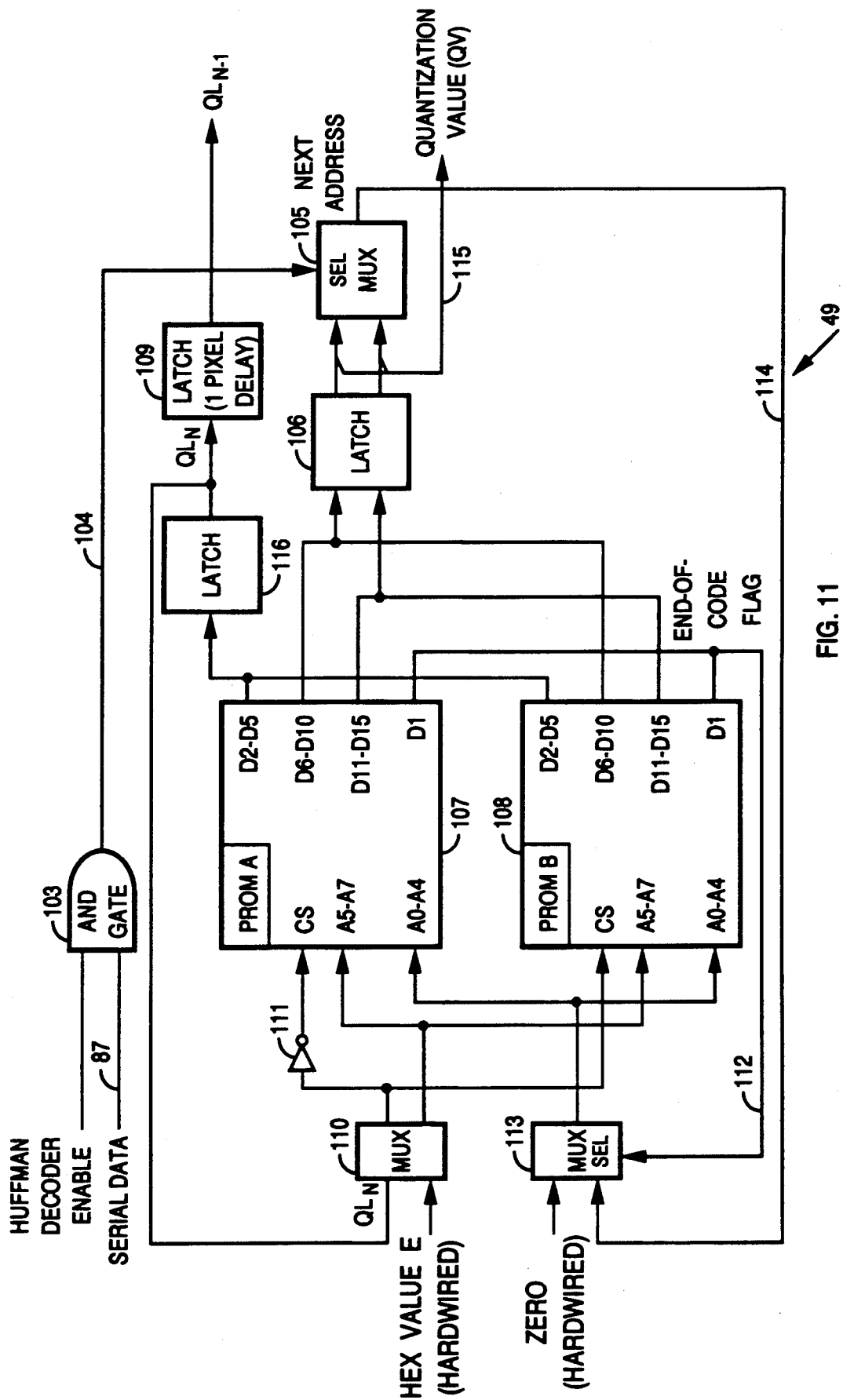
FIG. 11 is a block diagram of a Huffman decoder utilized in the decoder section of the real-time data compression system.

FIG. 11 is a detailed block diagram of the Huffman decoder circuit 49 shown in FIG. 3. In the Huffman decoder 49 a Huffman decoder enable signal and a serial data signal 87 are applied to an AND gate 103, the output of which is directed via a lead 104 to the select input of a multiplexer 105. The multiplexer 105 receives two other inputs from a latch 106 which receives a first input from output D6-D10 of a PROM 107 and also from output D6-D10 of a PROM 108. A second input to latch 106 is provided by outputs D11-15 of the PROMS 107 and 108. Outputs D2-D5 of the PROMS 107 and 108 are connected together and supplied to the latch 116. The output of latch 116 provides a $QL_N$ signal to the input of a one pixel delay 109 and into a first input of a multiplexer 110.

One output of multiplexer 110 is supplied to inputs A5-A7 of PROMS 107 and 108, while the second output is supplied to the CS (chip select) input of each PROM. However, the signal supplied to input CS of PROM 107 passes through an inverter 111. The D1 output of PROMS 107 and 108, the End-of-Code FLAG, are sent through a lead 112 to the select input of a multiplexer 113. Multiplexer 113 also receives an input from the output of multiplexer 105 through a lead 114, this input being the next address. A third input to multiplexer 113 is a zero value.

The two outputs of latch 106 supplied to multiplexer 105 are combined to provide an 8-bit value on a lead 115. This value is the QV value supplied to multiplexer 54 of FIG. 3.

Figure 12:
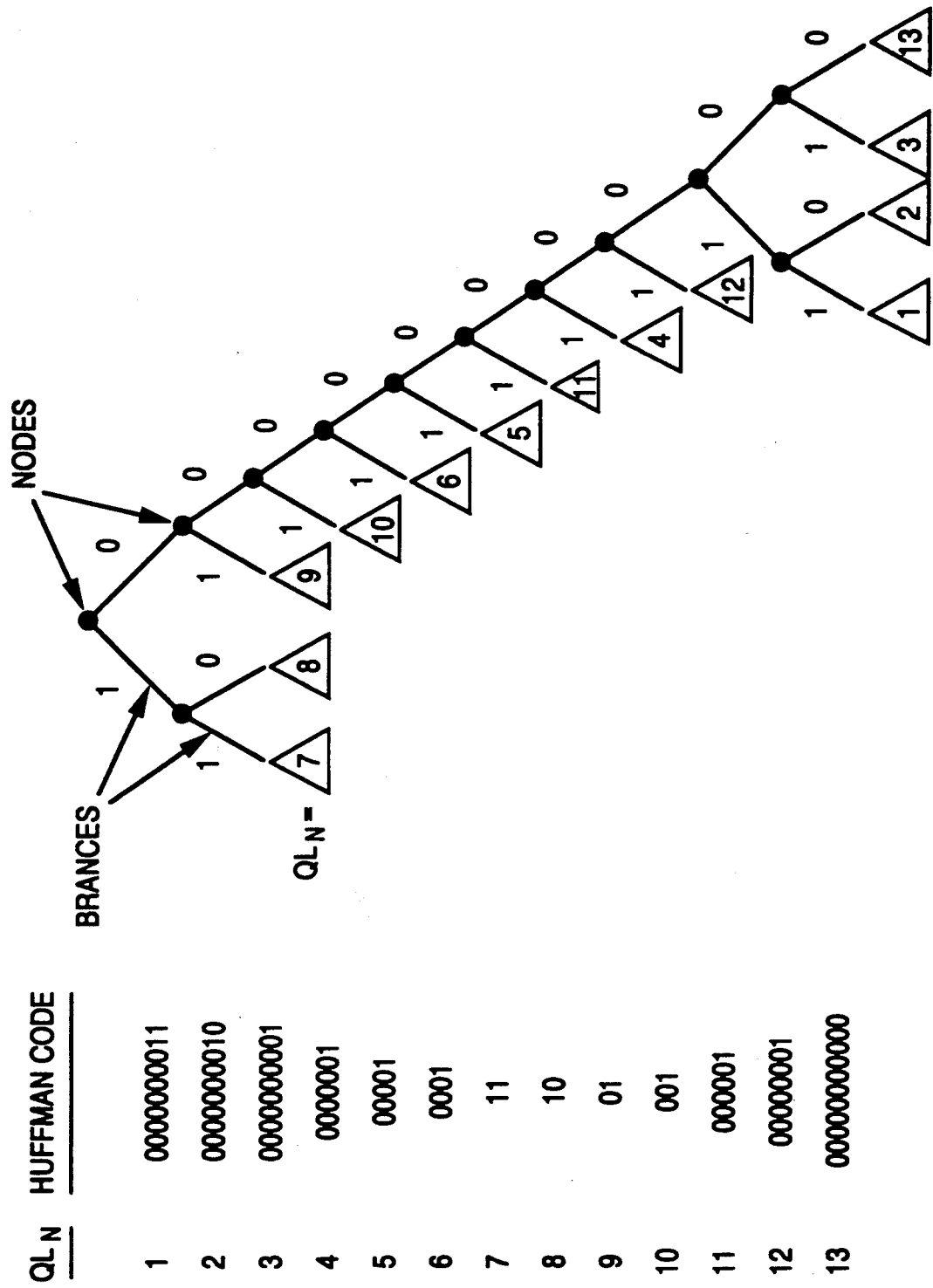
FIG. 12 is a chart showing an example Huffman code for quantization levels 1 through 13 and an associated Huffman tree.

An example Huffman code set and its associated Huffman code tree is shown in FIG. 12 and corresponds to the code set for quantization level 9 of the multilevel Huffman code sets. A tree search enables the Huffman code to be detected from a serial input of the code. As an example of a tree search, consider an input serial bit stream 000001, where the most significant bit (0) is the first bit received. Starting at the top node of the tree shown in FIG. 12, the first serial input bit (0) selects the right branch to the next node. At this node, the next input bit (0) also selects the right branch to the next node. This branching through the tree continues with each input bit until a node is reached that has no branches below. This indicates the end of the Huffman code.

Figure 13:
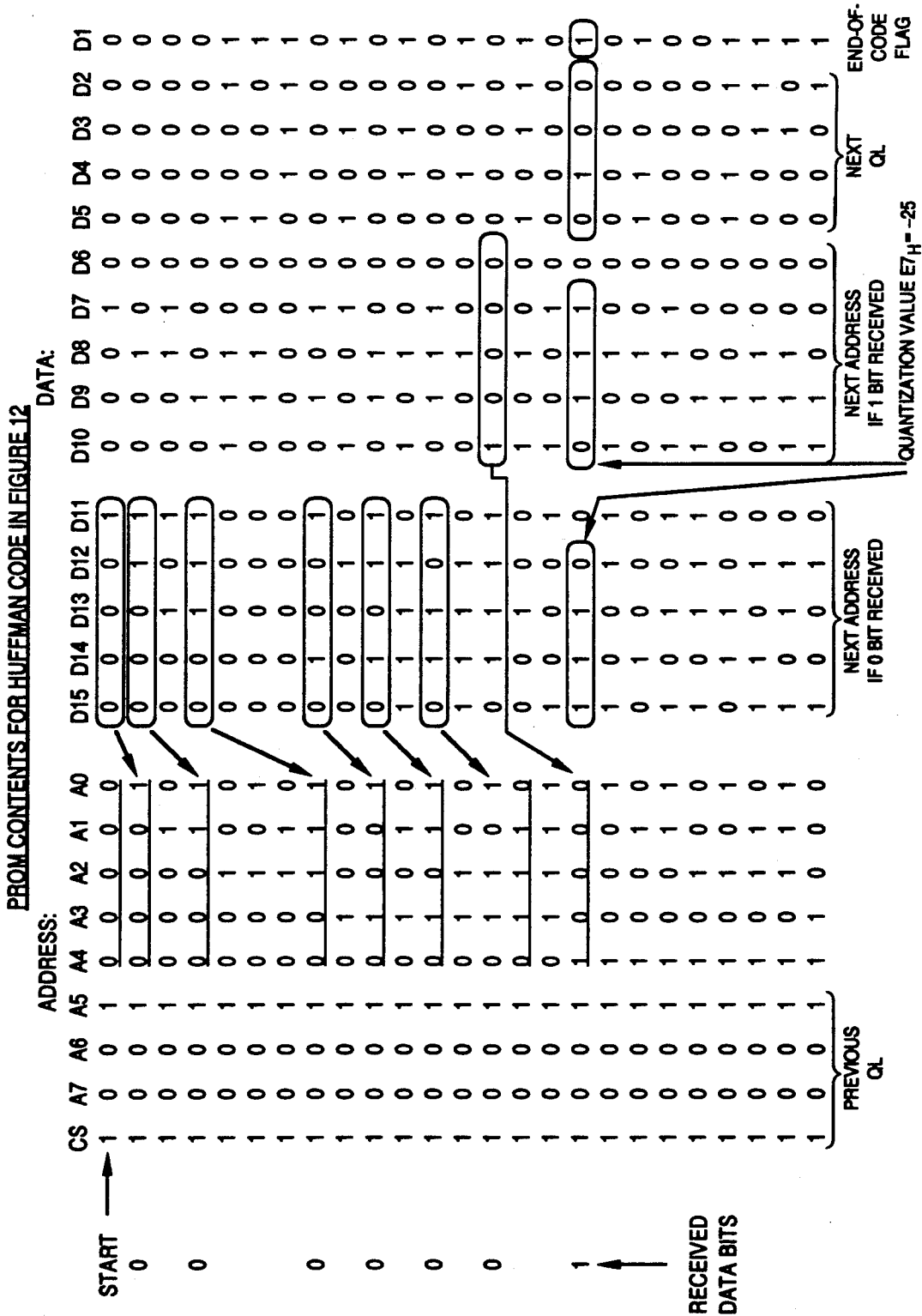
FIG. 13 is a chart showing the Huffman decoder programmable read only memory (prom) contents for the Huffman code of FIG. 12.

The contents of the PROMs 107 and 108 of FIG. 11 are shown in FIG. 13 for the Huffman code in FIG. 12. The tree search using the Huffman decoder apparatus shown in FIG. 11 works in the same manner as the example described above. The previous quantization level ($QL_{N-1}$) selects the correct Huffman code tree section of the PROM by addressing the three most significant address bits (A5-A7) and the chip select (CS) line. This area of PROM remains selected until the Huffman code is detected. The remaining five address bits (A-A4) are zeroed, indicating the top node of the tree. This first memory location that is addressed contains addresses of the next two possible nodes in the tree. Data bits D15 to D11 indicate the next address if a 0 bit is received and data bits D10 to D6 indicate the next address if a 1 bit is received. The serial input bit controls the select line to a multiplexer at the output of the PROM, and thereby causes a branch to the next node of the tree by selecting the next value of the 5 least significant address bits to the PROM. The new memory location contains the addresses of the next two possible tree nodes. The tree search continues until data bit D1 in the PROM (End-of-Code Flag) is a binary one which indicates the end of the Huffman code. At this point the memory also outputs a new quantization level and the associated quantization value. The five least significant address bits are then zeroed pointing to the top of the next Huffman code tree. FIG. 13 illustrates a numerical example of how the Huffman decoder apparatus performs a tree search.

The Huffman decoder enable signal disables the operation of the Huffman decoder during unique words and during the first four pixels of each line when the pixels are transmitted uncompressed.

A chart showing the lengths of each of the Huffman codes used in the multilevel Huffman encoder is shown in FIG. 14. The variable length nature of the Huffman codes allows more efficient transmission of the compressed image data by assignments of the shortest code words to the quantization levels that have the highest probability of occurrence. There is a tendency for neighboring pixels to fall into the same or close to the same quantization level. By taking advantage of this fact, the use of the Huffman code matrix (multilevel Huffman codes) in combination with the NAP significantly further reduces the amount of data needed to represent each pixel because nearly all pixels can be represented by very short code words.

Each of the 13 quantization levels is assigned a Huffman code set shown on the rows of the matrix in FIG. 14. The fourteenth row is used for startup purposes. The Huffman code sets were determined by compiling statistical data from numerous images with widely varying picture content during computer simulation of the invention. Probability of occurrence data was compiled for each of the 13 quantization levels as a function of the quantization level of the previous pixel. The Huffman code sets were then generated using this data.

In accordance with the invention, the composite analog video signal is sampled at four times the NTSC color subcarrier frequency rate (4×3.-579545 MHz). The DPCM predictor circuit 20 of FIG. 2 utilizes an intrafield approach with a 2-dimensional prediction based on averaging neighboring pixel values having the same color subcarrier phase relationship as the current pixel. The pixels used are the fourth previous pixel from the same line and the same pixel from two lines previous in the same field. These neighboring pixels have the same color subcarrier phasing as the current pixel and will therefore have a statistical likelihood of being highly correlated. The two pixel values are averaged to produce the prediction of the current pixel value (PV).

In FIG. 2, at the adder 21, the NAP value and the PV are subtracted from the current pixel value. This differs from the DPCM of the prior art where the predicted value would simply be subtracted from the current pixel value to obtain a difference value to be quantized. The NAP 25 estimates the difference value obtained when the prediction from DPCM predictor circuit 20 is subtracted from the current pixel value (PIX-PV). The subtraction of the NAP value from PIX-PV causes the resulting difference (DIF) value to be close to zero. The smaller the DIF, the more efficiently the quantized pixel information can be transmitted due to the use of Huffman coding prior to transmission over the radio frequency channel.

The Huffman coding assigns variable length code words based upon probability of occurrence. This was discussed with regard to FIGS. 8,12,13, and 14. The NAP 25 is non-adaptive in that its estimates are pre-stored and do not change with differing picture content. These pre-stored values were generated from statistics of numerous television images covering a wide range of picture content. The NAP values represent the average difference values calculated within the boundaries of the difference values for each quantization level over the range of example images used.

An important aspect of the data compression system embodying the invention is the multilevel Huffman coding process. Huffman coding of the quantized data allows shorter code words to be assigned to quantized pixels having the highest probability of occurrence. A separate set of Huffman codes has been generated for each of the 13 quantization levels. The matrix of code sets is used to reduce the number of data bits required to transmit a given pixel. The particular Huffman code set used for a given quantized pixel is determined by the quantization level of the previous pixel. For example, if the DIF value for the previous pixel resulted in quantization level 4 being selected for that pixel, then the Huffman code set selected for the current pixel would be code set 4, corresponding to the probability of occurrence of pixels falling into the fourth quantization level.

Referring to FIG. 4, the DPCM predictor which is used in both the encoder 11 and decoder 14 averages previous neighboring pixel values to predict the current pixel value. The previous pixels of the same color subcarrier phase as the current pixel are obtained by using a 4-pixel delay 34 and a 2-line delay 35. The 4-pixel delay is implemented using four 8-bit registers 65 through 68 in a shift register configuration.

The 2-line delay 35 is implemented using a RAM 70 which is addressed by a counter 72 that recycles every two lines. For the first two lines of each field, the RAM is loaded with the reconstructed values of the original pixels while the output register of the 2-line delay 35 is zeroed. For every line thereafter, the pixel value of two lines previous is read out of the RAM 70, and then the new reconstructed pixel (RP) value is written into the same memory location. Then the address counter 72 is incremented to the next memory location for the next pixel prediction.

As discussed previously, the PV output of the DPCM predictor circuit 20 is inverted and directed to adder 21 where it is combined with an inverted NAP signal and the PIX signal to yield a DIF value. Such inversion and addition processes combined with the carry-ins of adders 73 and 74 perform two's complement addition. The various DIF values are grouped into quantization levels created from a look-up table implemented in a PROM 22 of FIG. 5 using the DIF value as the address. The quantization levels are delayed by one pixel time in pixel delay 24 and used to address a PROM 25 look-up table to create an NAP output. The NAP 25 estimates the current DPCM difference value (PIX-PV) from the difference value of the immediate previous pixel.

The quantization value QV which is an estimation of the DIF, is created from a PROM look-up table in the quantization value ROM 30 of FIG. 2.

Referring again to FIG. 7, the current $QL_N$ and the immediately previous quantization level $QL_{N-1}$ address a PROM look-up table in the Huffman encoder 41. The PROM contains, at each location, a 1 to 12-bit Huffman code and a 4-bit code which specifies the length of the Huffman code.

The outputs of the multilevel Huffman encoder 41 are multiplexed with the first four pixels of every line so that the DPCM predictor circuit 20 of FIG. 2 has a valid starting point. The output of the multiplexer is fed into a bank of FIFO memories 42 in FIG. 2. Forty FIFO integrated circuit are configured with expanded width and depth to achieve a bank of FIFO memory 18 bits wide and 72 K deep. The FIFOs are necessary to compensate for the variable lengths of the Huffman codes and the differences between the FIFO input frequency and the FIFO output frequency. On the input side of the FIFOs, the data is written periodically at the pixel rate of 14.32 MHz. On the output side of the FIFOs, data is read out at a variable rate depending on the length of the Huffman codes and the frequency of the serial data.

Sixteen of the FIFOs bits are data (either actual pixel values for the first four pixels of each line or Huffman codes) and length of data. The other two bits are used to pass line and field flags indicating the start of each line and each field. The line and field flags are used for insertion of unique words into the data.

The unique word circuits 45 of FIG. 2, shown in greater detail in FIG. 7, are necessary to maintain proper field and line timing in the decoder 14. Because the Huffman codes vary in length, channel bit errors can result in improper detection of the codes by the decoder 14. Unique words allow the line and field timing to appropriately retime in the event of bit errors to minimize the impact on the quality of the reconstructed video images. Different unique word values are used for lines and fields so they can be detected separately by the appropriate DIP switches 79 and 80 shown in FIG. 7. In both cases, unique words were chosen to avoid duplication by valid Huffman codes. Sixteen-bit unique words are currently used. However, the unique word content and length can be changed if desired.

The line and field flags at the FIFO outputs are monitored to allow insertion of the unique words at the proper position within the data. When a line or field flag is detected, FIFO reads are stopped to allow time for the unique words to be multiplexed with the data in accordance with the circuitry shown in FIG. 7. Like the Huffman codes, the unique words must contain a 4-bit code indicating the length of the unique words. The unique words are divided into two 8-bit sections, each accompanied by a length code. After insertion of the unique word, the FIFO reads are reactivated. Subsequently, the data must be converted from the parallel format to a serial format for transmission over an RF channel. Because lengths of the Huffman codes vary, the variable length parallel-to-serial converter 44 of FIG. 2 is utilized. The converter 44 is shown in shown in FIG. 7 as a counter 81 and a shift register 82, shift register 82 being a 12-bit parallel load shift register. The Huffman codes are loaded into the shift register 82 and the 4-bit length of the Huffman code is loaded into the counter. The counter 81 counts down as the shift register 82 shifts out the data into a serial bit stream. When the counter reaches 0 the shifts stop and a new code is read from the FIFO memory. Next, the shift register 82 and the counter 81 are loaded with new values and the shifting process repeats.

The decoder circuit 14, as explained previously, receives the serial data that the encoder transmitted by means of an RF transmitter, and reconstructs a representation of the original 8-bit pixels, and using a digital-to-analog D/A converter 15, generates an analog video signal.

The inputs to the decoder circuit 14 consists of the serial data input signal through lead 52 and clock through lead 53, both of which connect to unique word detect circuit 48. The unique word detect circuit 48 allows detection of unique words with bit errors by selection of an error threshold of up to 3 bit errors. A more detailed block diagram of the unique word detect circuit 48 is contained in FIG. 9. The serial data is shifted into three 16-bit shift registers 84, 85, 86. The 16-bit parallel outputs of shift registers 85 and 86 are compared using exclusive-ORs 89 and 93, respectively, to the correct unique word value set in DIP switches 88 and 92. The bit-by-bit differences between the shift register outputs and the unique word DIP switches outputs are indicated at the 16-bit exclusive-OR outputs as high logic levels at the bit positions where the differences occurred. The outputs of the exclusive-ORs 89 and 93 are summed using adders 90 and 95, respectively, indicating the total number of unmatched bits. AND-OR logic circuits 91 and 94 at the output of the adders 90 and 95 allows selection of the error threshold and creates a pulse if a unique word with fewer differences than the error threshold is detected. The unique word detect pulse is AND-ed using AND gates 95 and 96 with a unique word windows signal which disallows unique word detects until close to the expected location of valid unique words. The windowing technique lowers the probability of false unique word detects.

The 16-bit shift register 84 contained in unique word detect circuit 48 provides the Huffman decoder 49 (FIG. 11) with serial data. When unique words are detected, the Huffman decoder is disabled with the Huffman decoder enable signal output from timing and control circuit 99 while the 16-bit unique word and following four pixel values, which are transmitted uncompressed, are purged from the shift register 84 to avoid Huffman decoding of unique words and uncompressed pixel (PIX) values. The shift register 84 also provides a parallel 16-bit PIX value lead 55 to multiplexer 54 to bypass the Huffman decoder circuit 49 during the first four pixels of each video line when the PIX values are transmitted uncompressed.

The Huffman decoder (FIG. 11) is implemented as a tree search in programmable read only memory. The address to the Huffman decoder PROMs 107 and 108 are initially set to zero via multiplexer output 113 starting the decoding process at the top node of the Huffman code tree. The contents of each memory location consists of the next two possible addresses to the memory denoting the next two tree branches. As each serial bit is received, it is used by multiplexer 105 to select the next memory address. A serial "one" selects one address (branch) and a serial "zero" selects the other address (branch). The new address (new tree node) also contains the next two possible tree branches based upon the next received serial bit on lead 104. The tree search continues in this manner until the least significant output bit, D1, of the memory (End-of-Code signal on lead 112) is high, indicating the end of a valid Huffman code. At this point, the other memory output bits, D2–D15, contain the correct quantization value (QV) and quantization level (QL) for the received Huffman code. The PROM address is then reset to zero (the top node of the tree) and the decoding process continues.

As the Huffman codes are detected, the resultant quantization levels and values are written into FIFO 56. This FIFO, as in the encoder, performs a rate buffering function absorbing the differences in the variable length Huffman codes and the pixel rate at the output of the decoder circuit. In conjunction with the unique word detect signals and the timing and control circuit 99 in FIG. 9 the FIFO 56 writes and reads are controlled to compensate for synchronization problems created by improper Huffman decoding due to bit errors.

The FIFO outputs, quantization level $QL_{N-1}$ and quantization value QV, are used by the non-adaptive predictor/adder circuit 50 and the DPCM predictor 51 to reconstruct the video image data. The $QL_{N-1}$ is used by an NAP PROM lookup table 61 to create the NAP value. The QV value is added to the nonadaptive prediction value (NAP) and the DPCM prediction value (PV) using adders 101 and 102 in FIG. 10 to create the reconstructed pixel values (RP). The decoder DPCM circuit 51 implementation is identical to the encoder DPCM circuit 20. The RP values are input to a D/A converter 15 which converts the reconstruct pixel values to an analog video signal.

Table I contains the 14 Huffman code sets used in the invention. Each set contains 13 Huffman codes one for each quantization level.

Table II lists the values contained in the Huffman encoder PROM (Programmable Read Only Memory). The PROM, consisting of two parallel 256×8 PROM integrated circuits, is addressed by the current quantization level ($QL_{N-1}$ which selects the Huffman code within a code set) and the immediately previous quantization level ($QL_{N-1}$, which selects the Huffman code set number). At each address the PROM data contents consists of 12 bits for the Huffman codeword value (in hexadecimal) and 4 bits indicating the length of the Huffman codeword which can vary from 1 bit to 11 bits (see Table I).

Table III lists the values contained in the Huffman decoder PROMs (PROM A and PROM B). A description of the Huffman decoder and the values contained in PROM A and PROM B was provided previously.

It will be understood that the above-described invention may be changed or modified or improved without departing from the spirit and scope of the invention as set forth in the claims appended hereto.

TABLE I

| CODE SET NUMBER | QUANTIZATION LEVEL | HUFFMAN CODE |
|---|---|---|
| 1 | 1 | 0001 |
|   | 2 | 0010 |
|   | 3 | 0011 |
|   | 4 | 0100 |
|   | 5 | 0101 |
|   | 6 | 0110 |
|   | 7 | 0111 |
|   | 8 | 1000 |
|   | 9 | 1001 |
|   | 10 | 1010 |
|   | 11 | 1011 |
|   | 12 | 1100 |
|   | 13 | 1101 |
| 2 | 1 | 00000111 |
|   | 2 | 00000110 |
|   | 3 | 0101 |
|   | 4 | 1 |
|   | 5 | 011 |
|   | 6 | 00000101 |
|   | 7 | 0100 |
|   | 8 | 0001 |
|   | 9 | 00000100 |
|   | 10 | 00000011 |
|   | 11 | 00000010 |
|   | 12 | 00000001 |
|   | 13 | 00000000 |
| 3 | 1 | 00000111 |
|   | 2 | 00011 |
|   | 3 | 11 |
|   | 4 | 10 |
|   | 5 | 01 |
|   | 6 | 0011 |
|   | 7 | 0010 |
|   | 8 | 00010 |
|   | 9 | 00001 |
|   | 10 | 00000011 |
|   | 11 | 00000010 |
|   | 12 | 00000001 |
|   | 13 | 00000000 |
| 4 | 1 | 0000000011 |
|   | 2 | 00000001 |
|   | 3 | 011 |
|   | 4 | 1 |
|   | 5 | 010 |
|   | 6 | 001 |
|   | 7 | 0001 |
|   | 8 | 00001 |
|   | 9 | 000001 |
|   | 10 | 0000001 |
|   | 11 | 0000000010 |
|   | 12 | 0000000001 |
|   | 13 | 0000000000 |
| 5 | 1 | 0000000011 |
|   | 2 | 00000001 |
|   | 3 | 000001 |
|   | 4 | 001 |
|   | 5 | 11 |
|   | 6 | 10 |
|   | 7 | 01 |
|   | 8 | 0001 |
|   | 9 | 00001 |
|   | 10 | 0000001 |
|   | 11 | 0000000010 |
|   | 12 | 0000000001 |
|   | 13 | 0000000000 |
| 6 | 1 | 00000000011 |
|   | 2 | 00000000010 |
|   | 3 | 00000001 |
|   | 4 | 00001 |
|   | 5 | 0001 |
|   | 6 | 01 |
|   | 7 | 1 |
|   | 8 | 001 |
|   | 9 | 000001 |
|   | 10 | 0000001 |
|   | 11 | 000000001 |
|   | 12 | 00000000001 |
|   | 13 | 00000000000 |
| 7 | 1 | 00000000011 |
|   | 2 | 00000000010 |
|   | 3 | 00000000001 |
|   | 4 | 0000001 |
|   | 5 | 00001 |
|   | 6 | 001 |
|   | 7 | 1 |
|   | 8 | 01 |
|   | 9 | 0001 |
|   | 10 | 000001 |
|   | 11 | 00000001 |
|   | 12 | 000000001 |
|   | 13 | 00000000000 |
| 8 | 1 | 00000000001 |
|   | 2 | 0000000011 |
|   | 3 | 0000000010 |
|   | 4 | 00000001 |
|   | 5 | 00001 |
|   | 6 | 001 |
|   | 7 | 1 |
|   | 8 | 01 |
|   | 9 | 0001 |
|   | 10 | 000001 |
|   | 11 | 0000001 |
|   | 12 | 0000000001 |
|   | 13 | 00000000000 |
| 9 | 1 | 0000000011 |
|   | 2 | 0000000010 |
|   | 3 | 0000000001 |
|   | 4 | 0000001 |

TABLE I-continued

HUFFMAN CODES

| CODE SET NUMBER | QUANTIZATION LEVEL | HUFFMAN CODE |
|---|---|---|
|  | 5 | 00001 |
|  | 6 | 0001 |
|  | 7 | 11 |
|  | 8 | 10 |
|  | 9 | 01 |
|  | 10 | 001 |
|  | 11 | 000001 |
|  | 12 | 00000001 |
|  | 13 | 0000000000 |
| 10 | 1 | 0000000011 |
|  | 2 | 0000000010 |
|  | 3 | 0000000001 |
|  | 4 | 0000001 |
|  | 5 | 000001 |
|  | 6 | 00001 |
|  | 7 | 0001 |
|  | 8 | 011 |
|  | 9 | 010 |
|  | 10 | 1 |
|  | 11 | 001 |
|  | 12 | 00000001 |
|  | 13 | 0000000000 |
| 11 | 1 | 00000101 |
|  | 2 | 00000100 |
|  | 3 | 00000001 |
|  | 4 | 0000011 |
|  | 5 | 000101 |
|  | 6 | 00011 |
|  | 7 | 0011 |
|  | 8 | 11 |
|  | 9 | 10 |
|  | 10 | 01 |
|  | 11 | 0010 |
|  | 12 | 000100 |
|  | 13 | 00000000 |
| 12 | 1 | 00001001 |
|  | 2 | 00001000 |
|  | 3 | 00000000 |
|  | 4 | 0000101 |
|  | 5 | 1011 |
|  | 6 | 1010 |
|  | 7 | 1001 |
|  | 8 | 1000 |
|  | 9 | 0011 |
|  | 10 | 111 |
|  | 11 | 110 |
|  | 12 | 0010 |
|  | 13 | 000011 |
| 13 | 1 | 0000 |
|  | 2 | 0001 |
|  | 3 | 0010 |
|  | 4 | 0011 |
|  | 5 | 0100 |
|  | 6 | 0101 |
|  | 7 | 0110 |
|  | 8 | 0111 |
|  | 9 | 1000 |
|  | 10 | 111 |
|  | 11 | 1001 |
|  | 12 | 1010 |
|  | 13 | 1011 |
| 14 | 1 | 001011 |
|  | 2 | 001010 |
|  | 3 | 001001 |
|  | 4 | 001000 |
|  | 5 | 000111 |
|  | 6 | 000110 |
|  | 7 | 1 |
|  | 8 | 000101 |
|  | 9 | 000100 |
|  | 10 | 0011 |
|  | 11 | 000011 |
|  | 12 | 000010 |
|  | 13 | 000001 |

TABLE II

HUFFMAN ENCODER MEMORY CONTENTS

| ADDRESS | | DATA | |
|---|---|---|---|
| QLN | QLN-1 | LENGTH | CODEWORD |
| 1 | 1 | 4 | 001 |
| 1 | 2 | 8 | 007 |
| 1 | 3 | 8 | 007 |
| 1 | 4 | A | 003 |
| 1 | 5 | A | 003 |
| 1 | 6 | B | 003 |
| 1 | 7 | B | 003 |
| 1 | 8 | B | 001 |
| 1 | 9 | A | 003 |
| 1 | A | A | 003 |
| 1 | B | 8 | 005 |
| 1 | C | 8 | 009 |
| 1 | D | 4 | 000 |
| 1 | E | 6 | 00B |
| 2 | 1 | 4 | 002 |
| 2 | 2 | 8 | 006 |
| 2 | 3 | 5 | 003 |
| 2 | 4 | 8 | 001 |
| 2 | 5 | 8 | 001 |
| 2 | 6 | B | 002 |
| 2 | 7 | B | 002 |
| 2 | 8 | A | 003 |
| 2 | 9 | A | 002 |
| 2 | A | A | 002 |
| 2 | B | 8 | 004 |
| 2 | C | 8 | 008 |
| 2 | D | 4 | 001 |
| 2 | E | 6 | 00A |
| 3 | 1 | 4 | 003 |
| 3 | 2 | 4 | 005 |
| 3 | 3 | 2 | 003 |
| 3 | 4 | 3 | 003 |
| 3 | 5 | 6 | 001 |
| 3 | 6 | 8 | 001 |
| 3 | 7 | B | 001 |
| 3 | 8 | A | 002 |
| 3 | 9 | A | 001 |
| 3 | A | A | 001 |
| 3 | B | 8 | 001 |
| 3 | C | 8 | 000 |
| 3 | D | 4 | 002 |
| 3 | E | 6 | 009 |
| 4 | 1 | 4 | 004 |
| 4 | 2 | 1 | 001 |
| 4 | 3 | 2 | 002 |
| 4 | 4 | 1 | 001 |
| 4 | 5 | 3 | 001 |
| 4 | 6 | 5 | 001 |
| 4 | 7 | 7 | 001 |
| 4 | 8 | 8 | 001 |
| 4 | 9 | 7 | 001 |
| 4 | A | 7 | 001 |
| 4 | B | 7 | 003 |
| 4 | C | 7 | 005 |
| 4 | D | 4 | 003 |
| 4 | E | 6 | 008 |
| 5 | 1 | 4 | 005 |
| 5 | 2 | 3 | 003 |
| 5 | 3 | 2 | 001 |
| 5 | 4 | 3 | 002 |
| 5 | 5 | 2 | 003 |
| 5 | 6 | 4 | 001 |
| 5 | 7 | 5 | 001 |
| 5 | 8 | 5 | 001 |
| 5 | 9 | 5 | 001 |
| 5 | A | 6 | 001 |
| 5 | B | 6 | 005 |
| 5 | C | 4 | 00B |
| 5 | D | 4 | 004 |
| 5 | E | 6 | 007 |
| 6 | 1 | 4 | 006 |
| 6 | 2 | 8 | 005 |
| 6 | 3 | 4 | 003 |
| 6 | 4 | 3 | 001 |
| 6 | 5 | 2 | 002 |
| 6 | 6 | 2 | 001 |
| 6 | 7 | 3 | 001 |
| 6 | 8 | 3 | 001 |

TABLE II-continued
HUFFMAN ENCODER MEMORY CONTENTS

| ADDRESS | | DATA | |
|---|---|---|---|
| QLN | QLN-1 | LENGTH | CODEWORD |
| 6 | 9 | 4 | 001 |
| 6 | A | 5 | 001 |
| 6 | B | 5 | 003 |
| 6 | C | 4 | 00A |
| 6 | D | 4 | 005 |
| 6 | E | 6 | 006 |
| 7 | 1 | 4 | 007 |
| 7 | 2 | 4 | 004 |
| 7 | 3 | 4 | 002 |
| 7 | 4 | 4 | 001 |
| 7 | 5 | 2 | 001 |
| 7 | 6 | 1 | 001 |
| 7 | 7 | 1 | 001 |
| 7 | 8 | 1 | 001 |
| 7 | 9 | 2 | 003 |
| 7 | A | 4 | 001 |
| 7 | B | 4 | 003 |
| 7 | C | 4 | 009 |
| 7 | D | 4 | 006 |
| 7 | E | 1 | 001 |
| 8 | 1 | 4 | 008 |
| 8 | 2 | 4 | 001 |
| 8 | 3 | 5 | 002 |
| 8 | 4 | 5 | 001 |
| 8 | 5 | 4 | 001 |
| 8 | 6 | 3 | 001 |
| 8 | 7 | 2 | 001 |
| 8 | 8 | 2 | 001 |
| 8 | 9 | 2 | 002 |
| 8 | A | 3 | 003 |
| 8 | B | 2 | 003 |
| 8 | C | 4 | 008 |
| 8 | D | 4 | 007 |
| 8 | E | 6 | 005 |
| 9 | 1 | 4 | 009 |
| 9 | 2 | 8 | 004 |
| 9 | 3 | 5 | 001 |
| 9 | 4 | 6 | 001 |
| 9 | 5 | 5 | 001 |
| 9 | 6 | 6 | 001 |
| 9 | 7 | 4 | 001 |
| 9 | 8 | 4 | 001 |
| 9 | 9 | 2 | 001 |
| 9 | A | 3 | 002 |
| 9 | B | 2 | 002 |
| 9 | C | 4 | 003 |
| 9 | D | 4 | 008 |
| 9 | E | 6 | 004 |
| A | 1 | 4 | 00A |
| A | 2 | 8 | 003 |
| A | 3 | 8 | 003 |
| A | 4 | 7 | 001 |
| A | 5 | 7 | 001 |
| A | 6 | 7 | 001 |
| A | 7 | 6 | 001 |
| A | 8 | 6 | 001 |
| A | 9 | 3 | 001 |
| A | A | 1 | 001 |
| A | B | 2 | 001 |
| A | C | 3 | 007 |
| A | D | 3 | 007 |
| A | E | 4 | 003 |
| B | 1 | 4 | 00B |
| B | 2 | 8 | 002 |
| B | 3 | 8 | 002 |
| B | 4 | A | 002 |
| B | 5 | A | 002 |
| B | 6 | 9 | 001 |
| B | 7 | 8 | 001 |
| B | 8 | 7 | 001 |
| B | 9 | 6 | 001 |
| B | A | 3 | 001 |
| B | B | 4 | 002 |
| B | C | 3 | 006 |
| B | D | 4 | 009 |
| B | E | 6 | 003 |
| C | 1 | 4 | 00C |
| C | 2 | 8 | 001 |
| C | 3 | 8 | 001 |
| C | 4 | A | 001 |
| C | 5 | A | 001 |
| C | 6 | B | 001 |
| C | 7 | 9 | 001 |
| C | 8 | A | 001 |
| C | 9 | 8 | 001 |
| C | A | 8 | 001 |
| C | B | 6 | 004 |
| C | C | 4 | 002 |
| C | D | 4 | 00A |
| C | E | 6 | 002 |
| D | 1 | 4 | 00D |
| D | 2 | 8 | 000 |
| D | 3 | 8 | 000 |
| D | 4 | A | 000 |
| D | 5 | A | 000 |
| D | 6 | B | 000 |
| D | 7 | B | 000 |
| D | 8 | B | 000 |
| D | 9 | A | 000 |
| D | A | A | 000 |
| D | B | 8 | 000 |
| D | C | 6 | 003 |
| D | D | 4 | 00B |
| D | E | 6 | 001 |

TABLE III
HUFFMAN DECODER PROM CONTENTS

| | Address | Data |
|---|---|---|
| PROM A | | |
| HUFFMAN CODE SET 8 ↓ | 00 | 0880 |
| | 01 | 1900 |
| | 02 | 001E |
| | 03 | 2980 |
| | 04 | 0322 |
| | 05 | 3A00 |
| | 06 | F51A |
| | 07 | 4A80 |
| | 08 | 0726 |
| | 09 | 5B00 |
| | 0A | F116 |
| | 0B | 6B80 |
| | 0C | 14AA |
| | 0D | 7C00 |
| | 0E | 252E |
| | 0F | 8C80 |
| | 10 | E392 |
| | 11 | 9D00 |
| | 12 | AD80 |
| | 13 | BE00 |
| | 14 | 4132 |
| | 15 | D30E |
| | 16 | B70A |
| | 17 | 6236 |
| | 18 | 9606 |
| UNUSED ADDRESSES | 19 | |
| | 1A | |
| | 1B | |
| | 1C | |
| | 1D | |
| | 1E | |
| | 1F | |
| HUFFMAN CODE SET 9 ↓ | 20 | 0880 |
| | 21 | 1900 |
| | 22 | 2980 |
| | 23 | 3A00 |
| | 24 | 0726 |
| | 25 | 0322 |
| | 26 | 001E |
| | 27 | 4A80 |
| | 28 | 14AA |
| | 29 | 5B00 |
| | 2A | F51A |
| | 2B | 6B80 |

TABLE III-continued
HUFFMAN DECODER PROM CONTENTS

| | Address | Data |
|---|---|---|
| | 2C | F116 |
| | 2D | 7C00 |
| | 2E | 252E |
| | 2F | 8C80 |
| | 30 | E392 |
| | 31 | 9D00 |
| | 32 | 4132 |
| | 33 | AD80 |
| | 34 | BE00 |
| | 35 | 6236 |
| | 36 | D30E |
| | 37 | B70A |
| | 38 | 9606 |
| | 39 | ⎫ |
| | 3A | ⎪ |
| | 3B | ⎬ UNUSED ADDRESSES |
| | 3C | ⎪ |
| | 3D | ⎪ |
| | 3E | ⎪ |
| | 3F | ⎭ |
| HUFFMAN CODE SET 10 ↓ | 40 | 0880 |
| | 41 | 1900 |
| | 42 | 14AA |
| | 43 | 2980 |
| | 44 | 3A00 |
| | 45 | 4A80 |
| | 46 | 252E |
| | 47 | 0726 |
| | 48 | 0322 |
| | 49 | 5B00 |
| | 4A | 001E |
| | 4B | 6B80 |
| | 4C | F51A |
| | 4D | 7C00 |
| | 4E | F116 |
| | 4F | 8C80 |
| | 50 | E392 |
| | 51 | 9D00 |
| | 52 | 4132 |
| | 53 | BE00 |
| | 54 | AD80 |
| | 55 | B70A |
| | 56 | 9606 |
| | 57 | 6236 |
| | 58 | D30E |
| | 59 | ⎫ |
| | 5A | ⎪ |
| | 5B | ⎬ UNUSED ADDRESSES |
| | 5C | ⎪ |
| | 5D | ⎪ |
| | 5E | ⎪ |
| | 5F | ⎭ |
| HUFFMAN CODE SET 11 ↓ | 60 | 0880 |
| | 61 | 1900 |
| | 62 | 2980 |
| | 63 | 3A00 |
| | 64 | 14AA |
| | 65 | 0726 |
| | 66 | 0322 |
| | 67 | 4A80 |
| | 68 | 5B00 |
| | 69 | 6B40 |
| | 6A | 73C0 |
| | 6B | 252E |
| | 6C | 001E |
| | 6D | 8440 |
| | 6E | 94C0 |
| | 6F | F51A |
| | 70 | A500 |
| | 71 | AD80 |
| | 72 | 4132 |
| | 73 | F116 |
| | 74 | BE00 |
| | 75 | CE80 |
| | 76 | E392 |
| | 77 | 6236 |
| | 78 | D30E |
| | 79 | B70A |
| | 7A | 9606 |

| | Address | Data |
|---|---|---|
| | 7B | ⎫ |
| | 7C | ⎬ UNUSED ADDRESSES |
| | 7D | ⎪ |
| | 7E | ⎪ |
| | 7F | ⎭ |
| HUFFMAN CODE SET 12 ↓ | 80 | 0880 |
| | 81 | 18C0 |
| | 82 | 2140 |
| | 83 | 31C0 |
| | 84 | 4240 |
| | 85 | 52C0 |
| | 86 | 6300 |
| | 87 | 6B80 |
| | 88 | 7C00 |
| | 89 | 8C80 |
| | 8A | 252E |
| | 8B | 14AA |
| | 8C | 9D00 |
| | 8D | 4132 |
| | 8E | 0726 |
| | 8F | 0322 |
| | 90 | 001E |
| | 91 | F51A |
| | 92 | F116 |
| | 93 | AD40 |
| | 94 | B5C0 |
| | 95 | C600 |
| | 96 | CE80 |
| | 97 | 6236 |
| | 98 | DEC0 |
| | 99 | E740 |
| | 9A | E392 |
| | 9B | D30E |
| | 9C | B70A |
| | 9D | 9606 |
| | 9E | ⎫ UNUSED ADDRESSES |
| | 9F | ⎭ |
| HUFFMAN CODE SET 13 ↓ | A0 | 0880 |
| | A1 | 1900 |
| | A2 | 2980 |
| | A3 | 3A00 |
| | A4 | 4A80 |
| | A5 | 5B00 |
| | A6 | 6B40 |
| | A7 | 73C0 |
| | A8 | 8440 |
| | A9 | 94C0 |
| | AA | A540 |
| | AB | B5C0 |
| | AC | C640 |
| | AD | 14AA |
| | AE | 9606 |
| | AF | B70A |
| | B0 | D30E |
| | B1 | E392 |
| | B2 | F116 |
| | B3 | F51A |
| | B4 | 001E |
| | B5 | 0322 |
| | B6 | 0726 |
| | B7 | 252E |
| | B8 | 4132 |
| | B9 | 6236 |
| | BA | ⎫ |
| | BB | ⎪ |
| | BC | ⎬ UNUSED ADDRESSES |
| | BD | ⎪ |
| | BE | ⎪ |
| | BF | ⎭ |
| HUFFMAN CODE SET 14 ↓ | C0 | 0880 |
| | C1 | 18C0 |
| | C2 | 001E |
| | C3 | 2140 |
| | C4 | 31C0 |
| | C5 | 4240 |
| | C6 | 52C0 |
| | C7 | 6340 |
| | C8 | 73C0 |

TABLE III-continued
HUFFMAN DECODER PROM CONTENTS

| | Address | Data |
|---|---|---|
| | C9 | 14AA |
| | CA | 8400 |
| | CB | 8C80 |
| | CC | 9D00 |
| | CD | AD80 |
| | CE | BE00 |
| | CF | CE80 |
| | D0 | 6236 |
| | D1 | 4132 |
| | D2 | 252E |
| | D3 | 0726 |
| | D4 | 0322 |
| | D5 | F51A |
| | D6 | F116 |
| | D7 | E392 |
| | D8 | D30E |
| | D9 | B70A |
| | DA | 9606 |
| | DB ⎫ | |
| | DC ⎬ UNUSED | |
| | DD ⎬ ADDRESSES | |
| | DE ⎬ | |
| | DF ⎭ | |
| | PROM B | |
| HUFFMAN | 20 | 0880 |
| CODE SET 1 | 21 | 1900 |
| ↓ | 22 | 8440 |
| | 23 | 2980 |
| | 24 | 52C0 |
| | 25 | 39C0 |
| | 26 | 4240 |
| | 27 | 9606 |
| | 28 | B70A |
| | 29 | D30E |
| | 2A | 6340 |
| | 2B | 73C0 |
| | 2C | E392 |
| | 2D | F116 |
| | 2E | F51A |
| | 2F | 001E |
| | 30 | 94C0 |
| | 31 | C600 |
| | 32 | A540 |
| | 33 | B5C0 |
| | 34 | 0322 |
| | 35 | 0726 |
| | 36 | 14AA |
| | 37 | 252E |
| | 38 | CE80 |
| | 39 | 4132 |
| | 3A | 6236 |
| | 3B ⎫ | |
| | 3C ⎬ UNUSED | |
| | 3D ⎬ ADDRESSES | |
| | 3E ⎬ | |
| | 3F ⎭ | |
| HUFFMAN | 40 | 0880 |
| CODE SET 2 | 41 | 1900 |
| ↓ | 42 | E392 |
| | 43 | 2940 |
| | 44 | 4240 |
| | 45 | 31C0 |
| | 46 | 6300 |
| | 47 | 0322 |
| | 48 | 52C0 |
| | 49 | F116 |
| | 4A | 001E |
| | 4B | D30E |
| | 4C | 6B80 |
| | 4D | 7C00 |
| | 4E | 8C80 |
| | 4F | BE00 |
| | 50 | CE80 |
| | 51 | 9D00 |
| | 52 | AD80 |
| | 53 | 0726 |
| | 54 | F51A |
| | 55 | B70A |
| | 56 | 9606 |

| | Address | Data |
|---|---|---|
| | 57 | 6236 |
| | 58 | 4132 |
| | 59 | 252E |
| | 5A | 14AA |
| | 5B ⎫ | |
| | 5C ⎬ | |
| | 5D ⎬ UNUSED | |
| | 5E ⎬ ADDRESSES | |
| | 5F ⎭ | |
| HUFFMAN | 60 | 0880 |
| CODE SET 3 | 61 | 1900 |
| ↓ | 62 | 2980 |
| | 63 | 3A00 |
| | 64 | F116 |
| | 65 | E392 |
| | 66 | D30E |
| | 67 | 4A80 |
| | 68 | 5B00 |
| | 69 | 6B80 |
| | 6A | 7C00 |
| | 6B | 001E |
| | 6C | F51A |
| | 6D | 8C80 |
| | 6E | 0726 |
| | 6F | 0322 |
| | 70 | B70A |
| | 71 | AD80 |
| | 72 | 9CC0 |
| | 73 | A500 |
| | 74 | 9606 |
| | 75 | BE00 |
| | 76 | CE80 |
| | 77 | 6236 |
| | 78 | 4132 |
| | 79 | 252E |
| | 7A | 14AA |
| | 7B ⎫ | |
| | 7C ⎬ UNUSED | |
| | 7D ⎬ ADDRESSES | |
| | 7E ⎬ | |
| | 7F ⎭ | |
| HUFFMAN | 80 | 0880 |
| CODE SET 4 | 81 | 1900 |
| ↓ | 82 | E392 |
| | 83 | 2980 |
| | 84 | 3A00 |
| | 85 | 4A80 |
| | 86 | F51A |
| | 87 | F116 |
| | 88 | D30E |
| | 89 | 5B00 |
| | 8A | 001E |
| | 8B | 6B80 |
| | 8C | 0322 |
| | 8D | 7C00 |
| | 8E | 0726 |
| | 8F | 8C80 |
| | 90 | 14AA |
| | 91 | 9D00 |
| | 92 | B70A |
| | 93 | AD80 |
| | 94 | BE00 |
| | 95 | 6236 |
| | 96 | 4132 |
| | 97 | 252E |
| | 98 | 9606 |
| | 99 ⎫ | |
| | 9A ⎬ | |
| | 9B ⎬ UNUSED | |
| | 9C ⎬ ADDRESSES | |
| | 9D ⎬ | |
| | 9E ⎬ | |
| | 9F ⎭ | |
| HUFFMAN | A0 | 0880 |
| CODE SET 5 | A1 | 1900 |
| ↓ | A2 | 2980 |
| | A3 | 3A00 |
| | A4 | 001E |
| | A5 | F51A |

TABLE III-continued
HUFFMAN DECODER PROM CONTENTS

| | Address | Data |
|---|---|---|
| | A6 | F116 |
| | A7 | 4A80 |
| | A8 | E392 |
| | A9 | 5B00 |
| | AA | 0322 |
| | AB | 6B80 |
| | AC | 0726 |
| | AD | 7C00 |
| | AE | D30E |
| | AF | 8C80 |
| | B0 | 14AA |
| | B1 | 9D00 |
| | B2 | B70A |
| | B3 | AD80 |
| | B4 | BE00 |
| | B5 | 6236 |
| | B6 | 4132 |
| | B7 | 252E |
| | B8 | 9606 |
| | B9 | } |
| | BA | |
| | BB | UNUSED |
| | BC | ADDRESSES |
| | BD | |
| | BE | |
| | BF | |
| HUFFMAN CODE SET 6 ↓ | C0 | 0880 |
| | C1 | 1900 |
| | C2 | 001E |
| | C3 | 2980 |
| | C4 | F51A |
| | C5 | 3A00 |
| | C6 | 0322 |
| | C7 | 4A80 |
| | C8 | F116 |
| | C9 | 5B00 |
| | CA | E392 |
| | CB | 6B80 |
| | CC | 0726 |
| | CD | 7C00 |
| | CE | 14AA |
| | CF | 8C80 |
| | D0 | D30E |
| | D1 | 9D00 |
| | D2 | 252E |
| | D3 | AD80 |
| | D4 | BE00 |
| | D5 | 6236 |
| | D6 | 4132 |
| | D7 | B70A |
| | D8 | 9606 |
| | D9 | |
| | DA | |
| | DB | UNUSED |
| | DC | ADDRESSES |
| | DD | |
| | DE | |
| | DF | |
| HUFFMAN CODE SET 7 ↓ | E0 | 0880 |
| | E1 | 1900 |
| | E2 | 001E |
| | E3 | 2980 |
| | E4 | 0322 |
| | E5 | 3A00 |
| | E6 | F51A |
| | E7 | 4A80 |
| | E8 | 0726 |
| | E9 | 5B00 |
| | EA | F116 |
| | EB | 6B80 |
| | EC | 14AA |
| | ED | 7C00 |
| | EE | E392 |
| | EF | 8C80 |
| | F0 | 252E |
| | F1 | 9D00 |
| | F2 | 4132 |
| | F3 | AD80 |
| | F4 | BE00 |
| | F5 | 6236 |
| | F6 | D30E |
| | F7 | B70A |
| | F8 | 9606 |
| | F9 | |
| | FA | |
| | FB | UNUSED |
| | FC | ADDRESSES |
| | FD | |
| | FE | |
| | FF | |

What is claimed:

1. An improved differential pulse code modulation system for data compression of a digitized video signal (PIX) comprising:
   means for generating $QL_N$ and $QL_{N-1}$ signals and a non-adaptive predicator value NAP signal;
   means for combining and value quantizing the $QL_N$ signal and the NAP signal to produce a reconstructed pixel RP signal;
   means for operating on the RP signal and the PIX signal to produce a PV predicted value PV signal for said means for producing $QL_N$ and $QL_{N-1}$ signals and a NAP signal; and,
   multilevel Huffman encoder means for operating on the $QL_N$ and $QL_{N-1}$ signals to produce coded serial data and clock pulses;

2. The system of claim 1 wherein said means for generating $QL_N$, $QL_{N-1}$ and NAP signals comprise:
   adder means for generating a difference value DIF signal;
   a 13 level quantizer read only memory ROM which receives the DIF signal and quantizes it to provide an output signal;
   multiplexer means which receives the quantizer ROM output and outputs the $QL_N$ signal to the Huffman encoder and said value quantization means;
   1 pixel delay means for receiving the $QL_N$ signal and outputting a $QL_{N-1}$ signal;
   non-adaptive predictor ROM means for operating on $QL_{N-1}$ to produce the NAP signal;
   means for adding in said adder a negative NAP signal, a negative PV signal, and the PIX signal whereby the DIF signal is produced.

3. The system of claim 1 wherein said means for combining and value quantizing the $QL_N$ signal and the NAP signal comprises:
   quantization value ROM means which receives a $QL_N$ signal and outputs a Quantization value QV signal; and
   adder means for combining the QV signal, the NAP signal and the PV signal to produce an RP signal for said means for operating on the RP signal.

4. The system of claim 1 wherein said means for operating on the RP signal and the PIX signal comprises:
   a 4-pixel delay means;
   a 2-line delay means;
   a first multiplexer for receiving PIX and RP inputs and directing a signal through each of said delay means;
   adder means for adding the signals from said delay means to produce an output;
   divide by 2 means;

second multiplexer means;
means for directing the output of the adder means directly to a first input of the second multiplexer and through the divide by 2 means to a second input of the multiplexer whereby the multiplexer produces a PV signal.

5. The system of claim 4 wherein the 4-pixel delay means comprises four 8-bit registers in a shift register configuration.

6. The system of claim 4 wherein the 2-line delay comprises: a random access memory RAM;
an address counter which recycles every two lines connected to the RAM to control same;
a tri-state latch connected between the first multiplexer and the RAM; and,
a latch connected between the RAM and the adder.

7. The system of claim 4 wherein said adder is an 8-bit full adder.

8. The system of claim 1 including a decoder for decompressing the coded video signal.

9. The system of claim 8 wherein the decoder comprises:
a Huffman decoder for receiving the encoded video signal;
a first in first out FIFO circuit having a QL output, a quantization value QV output, and an input, said input connected to the Huffman decoder, said QV output being connected to a first adder,
a non-adaptive predictor receiving a QL signal from said FIFO QL output and providing NAP signal to said first adder;
the output of said first adder being an RP signal which is the reconstructed, digitized video signal;
means for directing the output (RP) of the first adder through a four pixel delay to a second adder;
means for directing the output (RP) of the first adder through a two line delay to the second adder;
means for directing an output (PV) of the second adder through a divide by two circuit to said first adder to affect the RP signal in a prescribed manner.

10. The system of claim 9 wherein said Huffman decoder comprises:
first and second programmable read only memory PROM means;
a one pixel delay means;
a first multiplexer MUX for providing an address to said PROMs through a second MUX which sets the address to zero to start the decoding process;
a first latch connected between said PROMs and said first MUX, said first latch providing a quantization value QV signal;
a second latch connected between said PROMs and said one pixel delay means, the output of said second latch being quantization level $QL_N$, the output of said one pixel delay means being $QL_{N-1}$;
a third MUX connected to said PROM means to supply signals thereto, said third MUX being connected to said second latch to receive a $QL_N$ signal therefrom.

11. A differential pulse code modulation system for data compression of a digitized video signal (PIX) comprising:
a first adder for receiving the PIX signal and producing a difference value DIF signal;
a 13-level quantizer for processing the DIF signal to a quantization level $QL_N$ signal;
a non-adaptive predictor for converting the $QL_{N-1}$ signal to a non-adaptive predictor NAP signal and being connected from the output of the 13-level quantizer to the adder through an inverter;
a second adder;
a value quantizer connected between the output of the 13-level quantizer and said second adder;
means connecting the output of said non-adaptive predictor to said second adder;
a first-line delay means;
a second-line delay means connected serially with said first-line display means;
a four-pixel delay means;
a third adder;
a divide by two means;
means connecting the output of said second adder to said third adder through said pixel delay means and through said line delay means to different inputs of said third adder;
means for connecting an output of said third adder to an input of said divide by two circuit to produce a predicted value PV signal at an output of said divide by two circuit means for connecting the output of the divide by two circuit to the first adder and to the second adder;
Huffman encoder means receiving a quantization level QL signal from said 13-level quantizer;
first in, first out FIFO rate buffer means;
variable length, parallel-to-serial converter means;
means for connecting said FIFO means between said Huffman encoder and the converter means whereby the converter means outputs coded serial data and clock pulses.

12. The system of claim 11 wherein the variable length, parallel-to-serial converter compress:
a counter which receives a word length signal from the multiplexer;
a shift register which receives a data word from the multiplexer; and
means connecting the counter to the shift register to control the latter thereby producing a serial data and a clock output.

13. A method for coding a video signal comprising:
sampling the composite analog video signal at a rate four times the color subcarrier frequency (4×3.579545 MHz);
selecting the fourth previous pixel from the same line and the same pixel from two lines previous in the same field;
averaging the two-pixel values to produce the prediction value (PV) of the current pixel value;
means for generating a non-adaptive predictor NAP signal including a default NAP signal based on prestored values;
subtracting PV and NAP signals from the current pixel value PIX (PIX-PV-NAP) to yield a difference value DIF signal;
quantizing the DIF value in levels in accordance with stored values yielding a multilevel quantization value QL signal;
Huffman encoding the QL signal at each said levels;
converting the Huffman encoded signal to serial data and clock pulses.

14. A method of coding a digitized video signal (PIX) comprising the steps of:
generating a non-adaptive predictor NAP signal;
generating a predicted value PV signal;

inverting the non-adaptive predictor value NAP signal;

inverting the predicted value PV signal;

adding the PIX, the inverted NAP and the inverted PV signal using twos complement addition to produce a difference value DIF signal;

directing the DIF signal to a non-linear, non-adaptive quantizer to produce an output signal;

directing the output signal of the quantizer to a non-adaptive predictor which produces said NAP signal, to a multilevel Huffman encoder, and to a 1-pixel delay;

directing an output signal from the one-pixel delay to the multi-level Huffman encoder;

directing the output of the Huffman encoder to a shift register to produce encoded serial data and clock signals.

15. The method of claim 14 wherein the Huffman encoder looks up values in a programmable read only memory PROM table.

16. A method of coding a video signal comprising the steps of:

sampling the video signal at a rate four times the color subcarrier frequency of 3.579545 MHz to create a digitized video PIX signal;

converting the PIX signal to a difference value DIF signal;

converting the DIF signal to quantization level $QL_N$ and $QL_{N-1}$ signals having a plurality of levels; and encoding each level of the $QL_N$ and $QL_{N-1}$ signals to yield serial data and clock pulse signals.

17. The method of claim 16 wherein the $QL_N$ has 13 levels.

18. The method of claim 16 and including the steps of:

detecting said serial data and clock pulses to produce PIX and serial data signals;

operating on said PIX and serial data signals to produce PIX/QV and $QL_{N-1}$ signals;

operating on said PIX/QV and $QL_{N-1}$ signals to produce a reconstructed pixel RP signal;

operating on said PIX and RP signals to produce a reconstructed digitized video signal.

19. A data compression system for digitized video signals (PIX) comprising:

means for converting the PIX signal to a DIF signal;

means for converting the difference value DIF signal to quantization level $QL_N$ and $QL_{N-1}$ signals; and multilevel Huffman encoding means for converting the $QL_N$ and $QL_{N-1}$ signals to serial data and clock pulse signals;

a unique word detect means for outputting a serial data signal, a PIX signal and an enable signal;

means for transmitting said serial data and clock signals to said unique word detect means;

means for operating on the signals outputted by the unique word detect means to produced PIX/QV (PIX for pixels 1-4 of each line, and QV for all remaining pixels of each line) and $QL_{N-1}$ signals;

means for operating on the QV and $QL_{N-1}$ signals to produce an reconstructed pixel RP signal; and means for operating on said PIX and RP signals to produce a reconstructed, digitized video output.

* * * * *